United States Patent
Toyoda et al.

(10) Patent No.: US 7,883,170 B2
(45) Date of Patent: Feb. 8, 2011

(54) LIQUID DROPLET EJECTION APPARATUS AND METHOD FOR MANUFACTURING DEVICE

(75) Inventors: Naoyuki Toyoda, Suwa (JP); Tashiaki Mikoshiba, Suwa (JP); Toshiyuki Kobayashi, Chino (JP)

(73) Assignee: Seiko Epson Corporation (JP)

( * ) Notice: Subject to any disclaimer, the term of this patent is extended or adjusted under 35 U.S.C. 154(b) by 439 days.

(21) Appl. No.: 11/964,851

(22) Filed: Dec. 27, 2007

(65) Prior Publication Data

US 2008/0158309 A1 Jul. 3, 2008

(30) Foreign Application Priority Data

Dec. 27, 2006 (JP) ............... 2006-351393

(51) Int. Cl.
*B41J 29/38* (2006.01)

(52) U.S. Cl. ............... 347/17; 347/5; 347/6; 347/7; 347/8; 347/9; 347/10; 347/11; 347/12; 347/13; 347/14; 347/15; 347/16; 347/18; 347/19; 347/20; 347/84; 347/85; 347/91

(58) Field of Classification Search ............ 347/85–92, 347/5–40, 84–95

See application file for complete search history.

(56) References Cited

U.S. PATENT DOCUMENTS

| | | | | |
|---|---|---|---|---|
| 5,182,578 | A * | 1/1993 | Goepel et al. ............ | 347/60 |
| 5,471,230 | A * | 11/1995 | Saito et al. .............. | 347/29 |
| 6,315,402 | B1 * | 11/2001 | Kawase .................. | 347/85 |
| 6,712,460 | B2 * | 3/2004 | Ohashi et al. ............ | 347/86 |
| 6,773,099 | B2 | 8/2004 | Inoue et al. | |
| 7,004,575 | B2 | 2/2006 | Inoue et al. | |
| 7,506,972 | B2 * | 3/2009 | Aruga ................... | 347/86 |
| 7,540,595 | B2 * | 6/2009 | Kodama ................. | 347/70 |
| 7,543,922 | B2 * | 6/2009 | Kachi ................... | 347/84 |
| 7,549,716 | B2 * | 6/2009 | Kida et al. .............. | 347/10 |
| 7,648,230 | B2 * | 1/2010 | Kachi ................... | 347/85 |
| 2006/0215000 | A1 * | 9/2006 | Kachi ................... | 347/85 |
| 2009/0122093 | A1 | 5/2009 | Mutoh | |

FOREIGN PATENT DOCUMENTS

| | | |
|---|---|---|
| JP | 10-296988 | 11/1998 |
| JP | 11-248926 | 9/1999 |
| JP | 2002-355988 | 12/2002 |
| JP | 2003-251826 | 9/2003 |

(Continued)

*Primary Examiner*—Ryan Lepisto
*Assistant Examiner*—Guy G Anderson
(74) *Attorney, Agent, or Firm*—Harness, Dickey & Pierce, P.L.C.

(57) ABSTRACT

A liquid droplet ejection apparatus includes an ejection head having an ejection surface with an ejection outlet for ejecting a droplet of a functional liquid, a first container connected to the ejection head via a flow path to form a first space for containing the functional liquid that is to be supplied to the ejection head, a second container for containing the first container to form a second space between the first and the second containers, a pressure regulator for adjusting a pressure of the second space, and a temperature regulator for adjusting a temperature of the functional liquid of the first container, at least a part of the first container being made of a film deformed in accordance with an operation of the pressure regulator.

9 Claims, 14 Drawing Sheets

FOREIGN PATENT DOCUMENTS

| | | |
|---|---|---|
| JP | 2004-050537 | 2/2004 |
| JP | 2004-306393 | 11/2004 |
| JP | 2005-193695 | 7/2005 |
| JP | 2005-305973 | 11/2005 |
| JP | 2006-088090 | 4/2006 |
| JP | 2006-192785 | 7/2006 |
| JP | 2006-272627 | 10/2006 |

* cited by examiner

LIQUID DROPLET EJECTION APPARATUS AND METHOD FOR MANUFACTURING DEVICE

BACKGROUND

1. Technical Field

The present invention relates to a liquid droplet ejection apparatus and a method for manufacturing a device.

2. Related Art

As a method for forming a device pattern, there is known a liquid droplet ejection method (an ink-jet method), in which a pattern is formed on a substrate by ejecting a droplet of a functional liquid. For example, JP-A-1999-248926 discloses a technical example relating to a liquid droplet ejection apparatus (an ink-jet apparatus) that forms a pattern on a substrate based on the liquid droplet ejection method.

JP-A-1999-248926 is an example of related art.

The liquid droplet ejection apparatus includes an ejection head for ejecting a liquid droplet and a container connected to the ejection head via a flow path to form a space for containing a functional liquid. Conventionally, in order to suppress a leakage of the functional liquid or the like from an ejection outlet of the ejection head, for example, a valve mechanism such as a self-sealing valve is provided in the flow path connected to the ejection head and used to adjust a pressure of an inside space of the ejection head. In the use of the valve mechanism, for example, there can occur a problem such as a clogging of the flow path of the valve mechanism due to a part of the functional liquid (e.g. a solid component or a solute of the functional liquid). In that case, the liquid droplet ejection apparatus cannot smoothly eject a liquid droplet. Additionally, the part of the functional liquid clogging in the flow path thereof becomes a foreign substance that can deteriorate the performance of a device to be manufactured. Furthermore, when the valve mechanism has a complicated structure, the manufacturing cost of the apparatus can be increased and its maintenance tasks can be complicated. Moreover, depending on the structure of the container with the space for containing the functional liquid, physical properties of the functional liquid can be changed.

SUMMARY

An advantage of the invention is to provide a liquid droplet ejection apparatus capable of adjusting a pressure of a functional liquid in a simple structure, while suppressing a change in physical properties of the functional liquid. Additionally, another advantage of the invention is to provide a method for manufacturing a device by using the liquid droplet ejection apparatus.

In order to solve the above problems, the invention includes the following aspects.

A liquid droplet ejection apparatus according to a first aspect of the invention includes an ejection head having an ejection surface with an ejection outlet for ejecting a droplet of a functional liquid, a first container connected to the ejection head via a flow path to form a first space for containing the functional liquid that is to be supplied to the ejection head, a second container for containing the first container to form a second space between the first and the second containers, a pressure regulator for adjusting a pressure of the second space, and a temperature regulator for adjusting a temperature of the functional liquid of the first container, at least a part of the first container being made of a film deformed in accordance with an operation of the pressure regulator.

In the first aspect of the invention, the first container having the at least a part made of a film contains the functional liquid and is contained in the second container. The pressure of the second space formed between the first and the second containers is adjusted by the pressure regulator. Thereby, the ejection apparatus can adjust the pressure of the functional liquid in the simple structure, while suppressing the change in the physical properties of the functional liquid. For example, if the pressure of the first space formed by the first container is directly adjusted by a pressure regulator including a vacuuming system, a liquid component (for example, a dispersion medium or a solvent) of the functional liquid contained in the first space may be evaporated, so that at least one of the concentration and viscosity of the functional liquid can be changed. However, in the apparatus of the first aspect, instead of directly adjusting the pressure of the first space by the pressure regulator, the pressure regulator adjusts the pressure of the space between the first container having the at least a part made of the film and the second container. Thereby, the pressure of the first space can be adjusted to a desired level, while suppressing evaporation of the functional liquid and the change in the physical properties of the functional liquid, such as the concentration and/or viscosity thereof. Additionally, depending on the kind of the functional liquid, the physical properties thereof can change as temperature changes. However, since the ejection apparatus of the aspect includes the temperature regulator, it can suppress the change in the physical properties thereof due to the temperature change.

In the liquid droplet ejection apparatus of the first aspect, preferably, the pressure regulator adjusts the pressure of the second space in accordance with a positional relationship between a surface of the functional liquid of the first container and the ejection outlet of the ejection head. In this manner, the liquid droplet can be ejected in a desired state, while suppressing a leakage of the functional liquid from the ejection outlet thereof. For example, the pressure of the second space is adjusted in accordance with a positional relationship in a height direction (vertical direction) between the surface of the functional liquid of the first container and the ejection outlet of the ejection head, that is, in accordance with a so-called water head difference, in a state where the flow path is filled with the functional liquid. Thereby, the liquid droplet can be ejected in a desired state while suppressing the leakage of the functional liquid from the ejection outlet thereof.

In the ejection apparatus of the first aspect, preferably, the pressure regulator depressurizes the second space such that the surface of the functional liquid of the first container is located upper than the ejection outlet of the ejection head. In this manner, the liquid droplet can be ejected in a desired state while suppressing the leakage of the functional liquid from the ejection outlet thereof. For example, when a pressure near the ejection outlet is an atmospheric pressure, the pressure of the second space is reduced lower than at least the atmospheric pressure, whereby the liquid droplet can be ejected in a desired state while suppressing the leakage of the functional liquid from the ejection outlet of the ejection head.

Preferably, the liquid droplet ejection apparatus of the first aspect further includes a connector for detachably connecting the ejection head to the flow path, in which when the ejection head is detached from the flow path, the pressure regulator depressurizes the second space. In this manner, the ejection head can be detached from the flow path to exchange the ejection head with a new ejection head, while suppressing the leakage of the functional liquid, so that maintenance tasks and the like can be smoothly performed.

In the liquid droplet ejection apparatus of the first aspect, preferably, the temperature regulator cools the functional liquid of the first container. This can suppress the change in the physical properties of the functional liquid resulting from a temperature change. In addition, even when an operation of the liquid droplet ejection apparatus (the operation of ejecting a liquid droplet from the ejection outlet of the ejection head) is stopped for a long time, the change in the physical properties thereof can be suppressed by continuously cooling the functional liquid of the first container.

In the above apparatus, preferably, the temperature regulator reduces the temperature of the functional liquid of the first container lower than at least a temperature near the ejection outlet of the ejection head. In this manner, the liquid droplet can be ejected in a desired state from the ejection outlet of the ejection head, while suppressing the change in the physical properties of the functional liquid due to a temperature change.

In addition, the liquid droplet ejection apparatus of the first aspect may further include an opening formed in the second container to allow an inside space of the second container to communicate with an outside space thereof and an open/close mechanism for opening and closing the opening. In this manner, via the opening, various objects (media) can be taken in and out between the spaces inside and outside the second container. In addition, when adjusting the pressure of the inside space of the second container, the open/close mechanism closes the opening. Thus, the pressure of the inside space thereof can be favorably adjusted.

Additionally, in the liquid droplet ejection apparatus, preferably, the opening includes at least one of a first opening for passing the first container through between the inside space of the second container and the outside space thereof and a second opening for opening the inside space of the second container to the atmosphere. In this manner, the first container can be exchanged with a new one via the first opening. Furthermore, the second opening is provided in addition to the first opening through which the first container can pass. Thereby, for example, even in a state where the second space is depressurized, the open/close mechanism can be operated to allow the inside space of the second container to communicate with the outside space thereof via the second opening, thereby opening the second space to the atmosphere.

According to a second aspect of the invention, there is provided a method for manufacturing a device. The method includes ejecting a liquid droplet on a substrate by using the liquid droplet ejection apparatus of the first aspect to form a pattern thereon and drying the liquid droplet on the substrate.

In the second aspect thereof, a device exhibiting a desired performance can be manufactured by using the liquid droplet ejection apparatus that can adjust the pressure of a functional liquid in a simple structure, while suppressing a change in the physical properties of the liquid.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described with reference to the accompanied drawings. In the following description, a rectangular coordinate system having X, Y, and Z axes is set to be referred to when discussing positional relationships among constituent members. In this case, a predetermined direction within a horizontal plane is set as an X-axis direction, a direction orthogonal to the X-axis direction within the horizontal plane is set as a Y-axis direction, and a direction orthogonal (that is, a vertical direction) to each of the X-axis and Y-axis directions is set as a Z-axis direction. Additionally, rotation (inclination) directions around the X, Y, and Z axes are referred to as θX, θY, and θZ directions, respectively.

First Embodiment

Figure 1:
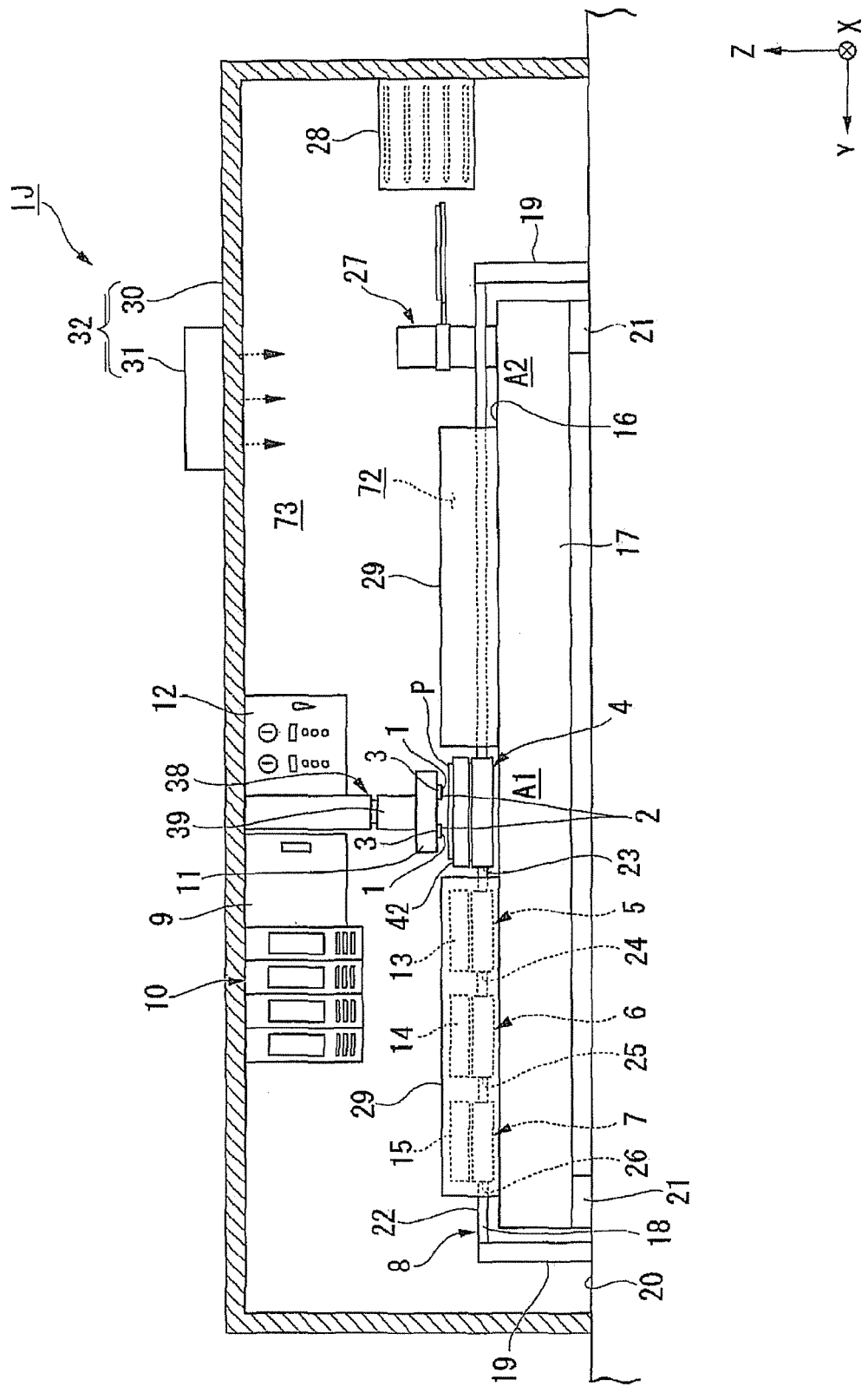
FIG. 1 is a schematic structural view of a liquid droplet ejection apparatus according to a first embodiment of the invention.
Figure 2:
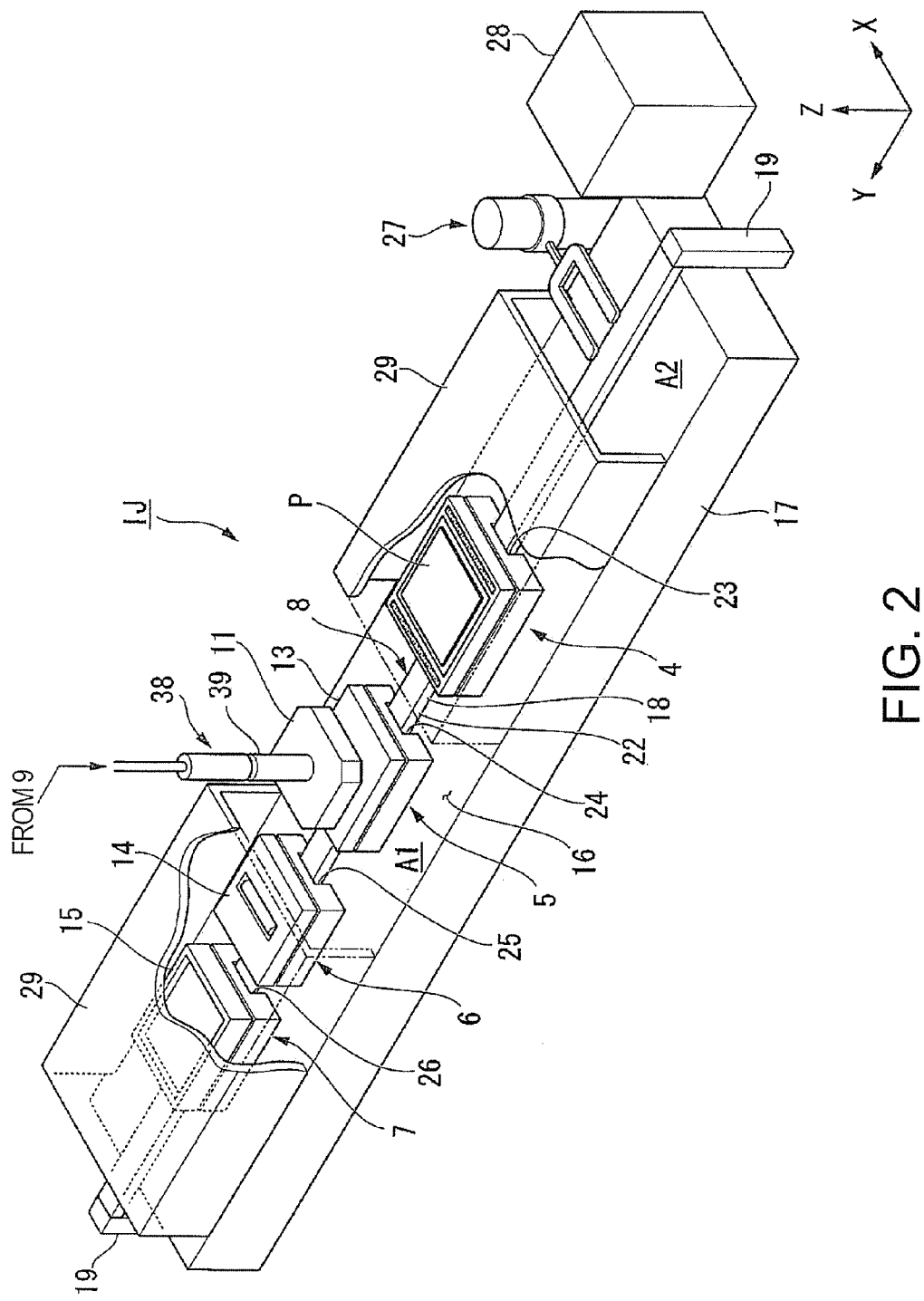
FIG. 2 is a perspective view of a part of the liquid droplet ejection apparatus according to the first embodiment.

A first embodiment of the invention will now be described. FIG. 1 is a schematic structural view showing a liquid droplet ejection apparatus IJ according to the first embodiment. FIG. 2 is a perspective view showing a part of the liquid droplet ejection apparatus IJ of the embodiment.

The liquid droplet ejection apparatus IJ ejects a liquid droplet D of a functional liquid on a substrate P to form a device pattern thereon. The ejection apparatus IJ includes an ejection head 3 having an ejection surface 2 with an ejection outlet 1 for ejecting the liquid droplet D thereof, a plurality (four in the present embodiment) of moving bodies 4, 5, 6, and 7 that are movable with respect to the ejection head 3 in a predetermined region including a first position A1 facing the ejection surface 2 and that are arranged along the Y axis, a driving unit 8 for moving the moving bodies 4 to 7 along the Y axis, a functional liquid containing unit 9 connected to the ejection head 3 via a flow path to contain the functional liquid that is to be supplied to the ejection head 3, and a controlling unit 10 for controlling an operation of the entire ejection apparatus IJ.

The liquid droplet ejection apparatus IJ of the present embodiment is a multi-head type ejection apparatus with the ejection head 3 including a plurality of ejection heads 3 and includes a carriage member 11 for supporting the ejection heads 3. Additionally, the ejection apparatus IJ includes a controller 12 including a driving circuit for controlling driving of the ejection heads 3. The controller 12 drives each of the ejection heads 3 based on a command of the controlling unit 10.

In the present embodiment, for example, the substrate P is a substrate used for forming a multilayer printed circuit board made of a low temperature co-fired ceramic (LTCC), as disclosed in JP-A-2006-114593, JP-A-2006-261146 and the like. The substrate P includes an LTCC substrate (green sheet) before sintering. Additionally, for example, the functional liquid includes a liquid obtained by dispersing conductive minute particles in a predetermined dispersion medium, as disclosed in JP-A-2005-34837. In the present embodiment, the conductive minute particles of the functional liquid are mainly made of silver minute particles (including organic silver compound particles or oxidized silver nanoparticles) and the dispersion medium is mainly made of water. The present embodiment is described by exemplifying a case where the liquid droplet ejection apparatus IJ ejects the liquid droplet D of the functional liquid including silver minute particles on an LTCC substrate (green sheet) before sintering to form a wiring pattern thereon by ejecting the liquid droplet D.

The ejection apparatus IJ includes at least three moving bodies. The ejection apparatus IJ of the present embodiment includes the four (first to fourth) moving bodies 4, 5, 6, and 7. The first moving body 4 is located on the most −Y side and the fourth moving body 7 is located on the most +Y side. In other words, among the four moving bodies 4 to 7 arranged along the Y axis, the first moving body 4 and the fourth moving body 7 are located at the extreme opposite ends thereof in a Y-axis direction. The second and the third moving bodies 5 and 6 are located between the first and the fourth moving bodies 4 and 7, where the second moving body 5 is located on the −Y side of the third moving body 6.

The first moving body 4 is movable while retaining the substrate P where a pattern is to be formed by ejecting the liquid droplet D. The second, the third, and the fourth moving bodies 5, 6 and 7 each include a maintenance unit for performing maintenance of the ejection head 3. In the present embodiment, the second moving body 5 includes a capping unit 13 for covering the ejection surface 2 of the ejection head 3. The third moving body 6 includes a wiping unit 14 for wiping off a foreign substance existing on the ejection surface 2. The fourth moving body 7 includes an immersing unit 15 for immersing at least a part of the ejection head 3 in a liquid other than the functional liquid.

The liquid droplet ejection apparatus IJ also includes a base member 17 having a supporting surface 16 for movably supporting the moving bodies 4, 5, 6 and 7. Each of the moving bodies 4 to 7 is movable along the supporting surface 16. In the present embodiment, the supporting surface 16 is approximately in parallel to an X-Y plane. Additionally, in the embodiment, an air bearing is formed between the supporting surface 16 of the base member 17 and a surface of each of the moving bodies 4 to 7 facing the supporting surface 16. The moving bodies 4 to 7 are supported by the air bearing in such a manner as not to contact with the supporting surface 16.

The ejection apparatus IJ further includes a guide member 18 for guiding the movements of the moving bodies 4 to 7 in the Y-axis direction. The guide member 18, which is a bar-shaped member elongated in the Y-axis direction, is arranged above the supporting surface 16. In the first embodiment, the guide member 18 is supported at opposite ends thereof by a supporting member 19 arranged outside the guide member 18. The supporting member 19 is supported by a floor surface 20. The base member 17 is supported by a supporting member 21 supported by the floor surface 20.

In the present embodiment, the driving unit 8 includes a linear motor and can independently move each of the moving bodies 4 to 7. The driving unit 8 includes a stator 22 of the linear motor arranged on the guide member 18 and movers 23, 24, 25 and 26 of the linear motor arranged on surfaces of the moving bodies 4 to 7 facing the guide member 18. The controlling unit 10 allows the driving unit 18 with the linear motor to independently move each of the moving bodies 4 to 7 on the base member 17.

Additionally, the liquid droplet ejection apparatus IJ includes a substrate carrying unit 27 arranged at a position different from that of the ejection head 3 to perform at least one of an operation of carrying the substrate P to the first moving body 4 and an operation of carrying the substrate P therefrom. Near the substrate carrying unit 27 is arranged a substrate containing unit 28 capable of containing the substrate P.

Specifically, the substrate carrying unit 27 performs at least one of the operation of carrying the substrate P to the first moving body 4 located at a second position A2 different from a first position A1 in the Y-axis direction and the operation of carrying the substrate P therefrom. The first position A1 is located apart from the second position A2 in the Y-axis direction. In the present embodiment, the first position A1 is located on the +Y side of the second position A2. The first moving body 4 is movable along the supporting surface 16 of the base member 17 between the first position A1 facing the ejection surface 2 of the ejection head 3 and the second position A2 near the substrate carrying unit 27.

For example, the substrate carrying unit 27 can carry the substrate P contained in the substrate containing unit 28 to the first moving body 4 located at the second position A2, as well as can carry the substrate therefrom at the second position A2 to contain it in the substrate containing unit 28.

Furthermore, in the embodiment, the liquid droplet ejection apparatus IJ includes an insulating member 29 arranged on at least a part of a moving route of the first moving body 4 to block the diffusion of heat of the first moving body 4 to a peripheral area. The insulating member 29 is disposed at a predetermined position of the base member 17 so as not to disturb the movement of the moving bodies 5, 6, and 7 in addition to the first moving body 4.

Additionally, the liquid droplet ejection apparatus IJ includes a chamber unit 32 including a chamber main body 30 containing units and members including the ejection head 3, the carriage member 11, the moving bodies 4 to 7, the base member 17, the guide member 18, the substrate carrying unit 27, the substrate containing unit 28, the insulating member 29, the functional liquid containing unit 9, the controller 12, and the controlling unit 10 as described above, as well as an air-conditioning unit 31 capable of adjusting environmental conditions (pressure, temperature, humidity, cleanness level, and the like) of an inside space of the chamber main body 30.

In the present embodiment, the chamber unit 32 adjusts a pressure of the inside space of the chamber main body 30 such that at least a pressure near the ejection outlet 1 becomes almost equal to an atmospheric pressure. In addition, in the embodiment, the chamber unit 32 adjusts a temperature of the inside space of the chamber main body 30 such that at least a temperature near the ejection outlet 1 becomes almost equal to a room temperature (e.g. 22 degrees C.).

Figure 3:
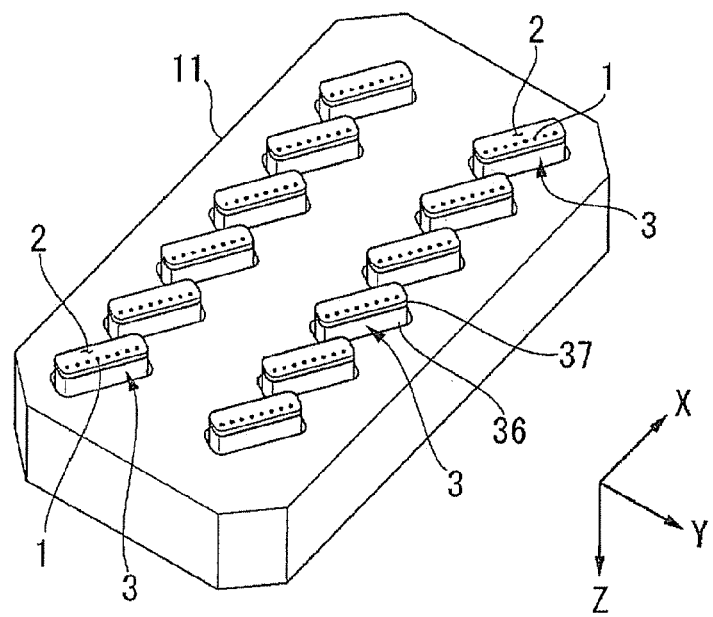
FIG. 3 is a perspective view from the bottom side of a plurality of ejection heads supported by a carriage member.
Figure 4:
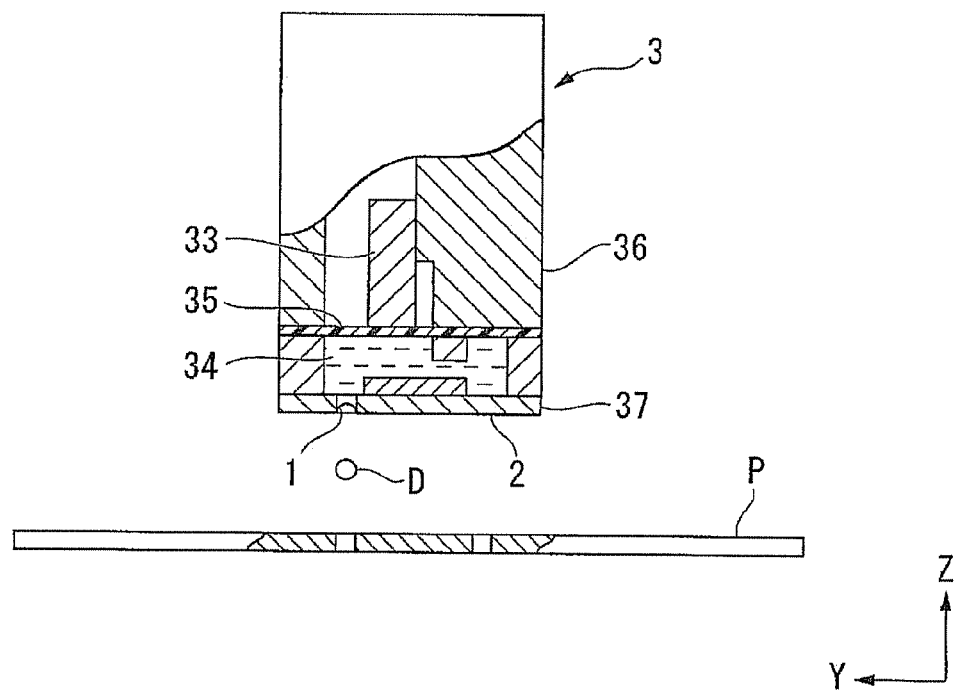
FIG. 4 is a sectional view for explaining an example of the structure of the ejection head.

Next, the ejection head 3 will be described with reference to FIGS. 3 and 4. FIG. 3 is a perspective view from the bottom side of the ejection heads 3 supported by the carriage member 11. FIG. 4 is a sectional view for explaining an example of the structure of each of the ejection heads 3.

The ejection head 3 of the present embodiment supplies a predetermined driving signal to a piezo element (piezoelectric element) 33 to deform the element, thereby changing the pressure of a space 34 containing the functional liquid by using a flexible vibration plate (film) 35 interposed between the space and the element. Then, changing the pressure of the space 34 allows the liquid droplet D of the functional liquid to be ejected from the ejection outlet 1. Thus, the ejection head 3 is configured so as to use a so-called electromechanical conversion system. The controller 12 drives the ejection head 3 based on a command of the controlling unit 10. The controller 12 supplies a predetermined driving signal to the piezo element 33 of the ejection head 3, so that each ejection outlet 1 can eject the liquid droplet D having a size in accordance with the driving signal.

As shown in FIG. 3, the liquid droplet ejection apparatus IJ of the present embodiment includes the plurality of ejection heads 3. The ejection heads 3 are supported by the carriage member 11. Each of the ejection heads 3 has the ejection surface (nozzle-formed surface) 2 having the ejection outlet (ejection nozzle) 1 for ejecting the liquid droplet D of the functional liquid. The ejection surface 2 has a long shape (an approximately rectangular shape in the present embodiment) in a predetermined direction. The ejection outlet 1 includes a plurality of ejection outlets formed along the predetermined direction (a longitudinal direction of the ejection surface 2) on the ejection surface 2. In the present embodiment, the predetermined direction in which the plurality of ejection outlets 1 are arranged is a direction inclined with respect to the X-axis direction within the X-Y plane.

As shown in FIG. 4, the ejection head 3 includes a head main body 36 and a plate member (nozzle plate) 37 arranged at a lower end of the head main body 36. The ejection outlets 1 are formed in the plate member 37. The plate member 37 has a plurality of holes penetrating through in upper and lower directions thereof. The ejection outlets 1 are located at the lower ends of the holes. The ejection surface 2 is arranged on the plate member 37.

In the present embodiment, the ejection surface 2 of the ejection head 3 (plate member 37) is directed toward the lower side (−Z side). A surface of the substrate P where the liquid droplet D is ejected (supplied) from the ejection head 3 is directed toward the upper side (+Z side) so as to face the ejection surface 2 of the ejection head 3. The first moving body 4 retains the substrate P such that the surface of the substrate P is directed toward the upper side (+Z side). In addition, the ejection surface 2 of the ejection head 3 is approximately in parallel to the X-Y plane. The first moving body 4 retains the substrate P such that the surface of the substrate P is approximately in parallel to the X-Y plane. The controlling unit 10 allows the liquid droplet D to be ejected on the substrate P from the ejection outlets 1 in a state where a distance (platen gap) between the ejection surface 2 of the ejection head 3 and the surface of the substrate P retained by the first moving body 4 is maintained at a predetermined value (e.g. 600 μm).

In addition, the ejection head 3 includes the space (cavity) 34 formed on the plate member 37 (ejection outlet 1), the flexible plate (vibration plate) 35 arranged on the cavity 34, and the piezo element 33 arranged on the vibration plate 35. The cavity 34 includes a plurality of cavities formed so as to correspond to each of the ejection outlets 1. The cavity 34 is connected to the functional liquid containing unit 9 via the flow path and contains the functional liquid sent from the functional liquid containing unit 9 to supply it to the ejection outlet 1.

The vibration plate 35 can change a pressure (capacity) of the cavity 34 by vibrating upwardly and downwardly. The piezo element 33 can vibrate the vibration plate 35 upwardly and downwardly and includes a plurality of piezo elements 33, which are arranged so as to correspond to each of the ejection outlets 1. Additionally, the piezo element 33 vibrates the vibration plate 35 based on a driving signal from the controller 21 to change the pressure of the cavity 34, thereby allowing the liquid droplet D of the functional liquid to be ejected from the ejection outlet 1.

For example, as disclosed in JP-A-2001-58433, the controller 12 adjusts the driving signal (a driving waveform) supplied to the piezo element 33 so as to adjust the amount (a size or a volume) of the liquid droplet D ejected from each of the ejection outlets 1.

As shown in FIG. 1, the liquid droplet ejection apparatus IJ of the present embodiment includes a retaining unit 38 for retaining the ejection heads 3 such that positions of the ejection heads 3 are not almost moved. The retaining unit 38 includes the carriage member 11 and the supporting mechanism 39 for supporting the carriage member 11. In the embodiment, the supporting mechanism 39 is fixed to a ceiling surface (an inner surface) of the chamber main body 30. In other words, the ejection heads 3 of the present embodiment are retained via the retaining unit 38 including the carriage member 11 and the supporting mechanism 39 such that they almost do not move with respect to the ceiling surface (inner surface) of the chamber main body 30.

In the present embodiment, the supporting mechanism 39 includes an actuator allowing a slight movement of the carriage member 11. The supporting mechanism 39 can slightly move the carriage member 11 in six directions (six degrees of freedom), namely, in the directions of the X, $Y^\theta$, Z, $\theta X$, $\theta Y$, and $\theta Z$ axes.

Figure 5A:
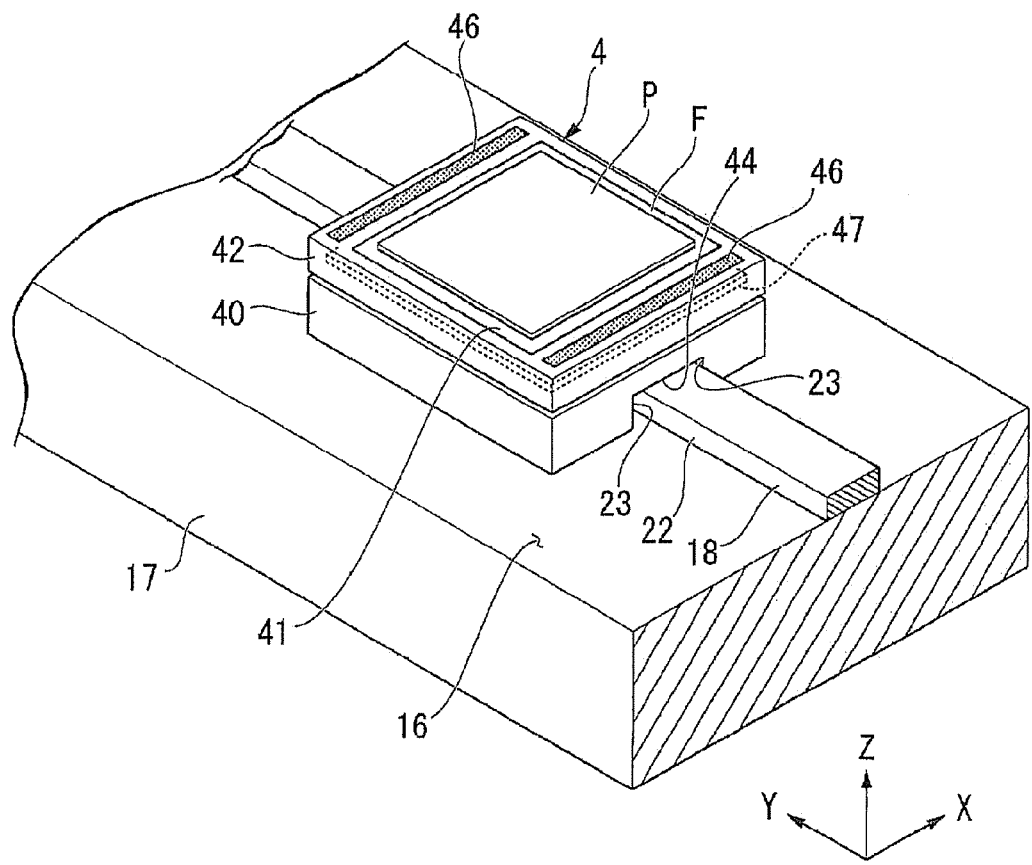
FIGS. 5A and 5B are illustrations showing an example of a first moving body.
Figure 5B:
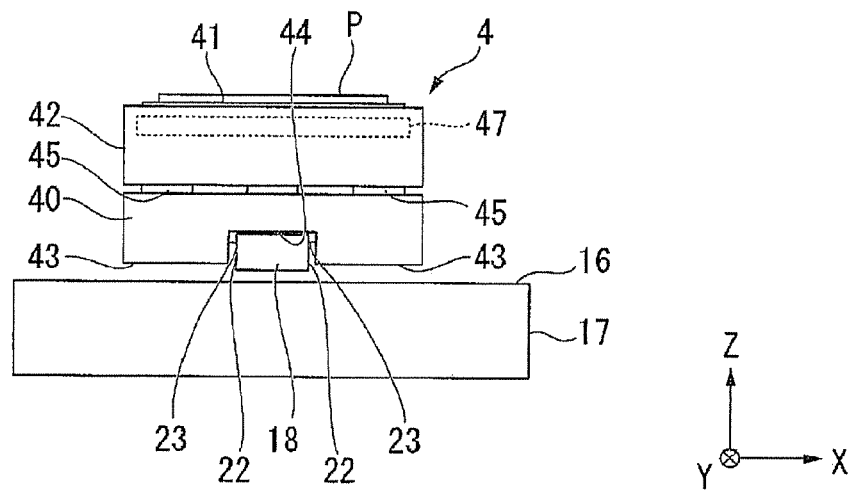

Next, the first moving body 4 will be described by referring to FIGS. 5A and 5B. FIG. 5A is a perspective view of the first moving body 4, and FIG. 5B is a perspective view from the −Y side of the first moving body 4.

The first moving body 4 is movable while retaining the substrate P where a pattern is formed by ejecting the liquid droplet D. The first moving body 4 includes a first movable member 40 having the mover 23 of the linear motor and a holder member 42 mounted on the first movable member 40 and having a retaining mechanism 41 retaining the substrate P. On a lower surface of the first movable member 40 facing the supporting surface 16 of the base member 17, there is formed an air bearing 43. The first movable member 40 is supported by the air bearing 43 so as not to contact with the supporting surface 16. The holder member 42 of the first moving body 4 retains the substrate P in such a manner that the surface of the substrate P faces the ejection surface 2 of the ejection head 3 and also is approximately in parallel to the X-Y plane.

As described above, the substrate P of the present embodiment includes the green sheet, in which via-holes are formed to penetrate through in a thickness direction of the sheet. For example, on a back surface of the substrate P (green sheet) is attached a film F made of polyethylene terephthalate (PET), where the holder member 42 of the first moving body 4 retains the substrate P in the state of being supported by the film F. In short, in the present embodiment, the holder member 42 of the first moving body 4 retains the substrate P (green sheet) via the film F.

On a lower surface of the first movable member 40 is formed a recessed portion 44, where the guide member 18 can be arranged. An inner surface of the recessed portion 44 of the first movable member 40 faces the guide member 18. As described above, the guide member 18 includes the stator 22 of the linear motor. On the inner surface of the recessed portion 44 thereof facing the guide member 18 is arranged the mover 23 of the linear motor. The driving unit 8 including the stator 22 and the mover 23 can move the first movable member 40 in the Y-axis direction. In addition, along with the movement of the first movable member 40 in the Y-axis direction, the holder member 42 (substrate P) mounted on the first movable member 40 is also moved together therewith in the Y-axis direction.

In the present embodiment, between the first movable member 40 and the holder member 42 are arranged a plurality of actuators 45. The actuator 45 includes a piezo element, for example. The controlling unit 10 controls the actuators 45 to allow the holder member 42 retaining the substrate P to be slightly moved on the first movable member 40. In the present embodiment, the holder member 42 retaining the substrate P can be slightly moved on the first movable member 40 by the actuators 45 in the directions of the six degrees of freedom, that is, in the directions of the X, Y, Z, θX, θY, and θZ axes.

In order to supply the liquid droplet D ejected from the ejection head 3 onto the substrate P, the controlling unit 10 allows the driving unit 8 to move the first moving body 4 so as to locate the substrate P retained by the first moving body 4 (the holder member 42) at the first position A1 facing the ejection surface 2 of the ejection head 3. Then, in order to supply the liquid droplet D ejected from the ejection outlet 1 of the ejection surface 2 at a predetermined position on the substrate P, the controlling unit 10 allows the actuators 45 arranged between the first movable member 40 and the holder member 42 to adjust the distance (platen gap) between the ejection surface 2 thereof and the surface of the substrate P retained by the first moving body 4, a positional relationship of inclining directions (θX and θY directions) between those surfaces, and a positional relationship of rotating directions (θZ directions) therebetween. Specifically, the controlling unit 10 allows the actuators 45 to adjust the positional relationship between the ejection surface 2 thereof and the surface of the substrate P retained by the first moving body 4 such that the surfaces are approximately in parallel to each other and also the platen gap therebetween has a predetermined value.

Furthermore, in the present embodiment, on an upper surface of the holder member 42 that can face the ejection surface 2 of the ejection head 3, a flushing region 46 is arranged at opposite ends in the Y-axis direction of the retaining mechanism 41 retaining the substrate P. The flushing region 46 is formed on an upper surface of a porous member that can absorb the liquid droplet D ejected from the ejection outlet 1 of the ejection head 3. For example, the porous member includes a sponge-like member. Before supplying the liquid droplet D on the substrate P from the ejection head 3, the controlling unit 10 performs an operation of ejecting the liquid droplet D in advance from the ejection outlet 1, namely, a so-called flushing operation, in a state where the ejection outlet 1 of the ejection head 3 faces the flushing region 46 of the holder member 42.

In addition, the first moving body 4 includes a heater 47 for heating the substrate P. The heater 47 is included in the holder member 42. The controlling unit 10 allows the heater 47 of the holder member 42 to heat the substrate P retained by the holder member 42.

The heater 47 enables momentary evaporation of a liquid component included in the liquid droplet D that is ejected from the ejection outlet 1 of the ejection head 3 and then supplied on (contacted with) the substrate P. While allowing the heater 47 to heat the substrate P, the ejection apparatus IJ supplies the liquid droplet D on the heated substrate P from the ejection outlet 1 of the ejection head 3, thereby momentarily drying the liquid droplet D that contacts with the substrate P.

In addition, supplying the liquid droplet D on the substrate P in the state of being heated can generate a pinning phenomenon. In the process of drying the liquid droplet D supplied on the substrate P, when the density of a solid content at an edge of the liquid droplet D reaches a saturation level, the solid content is locally deposited at the edge thereof. Then, the edge of the liquid droplet D is pinned by the deposited solid content, thereby suppressing contraction of the liquid droplet D (contraction of an outer diameter thereof) due to drying after that. In this manner, the pinning phenomenon is generated in which the contraction of the liquid droplet D due to drying is suppressed by the solid content deposited at the edge, whereby an edge (outline) of the pattern formed on the substrate P (a wiring pattern in the embodiment) can be desirably defined.

For example, as disclosed in JP-A-2005-28276, JP-A-2005-144324 and the like, the pinning phenomenon may be generated in the liquid droplet D ejected (supplied) on the substrate P by adjusting conditions for drying and convection of the liquid droplet D placed on the surface of the substrate P.

In the following description, a pattern formation process, as appropriate, represents a process in which the substrate P of the first moving body 4 is located at the first position A1 and the liquid droplet D is ejected thereon from the ejection outlet 1 to form a pattern.

Figure 6:
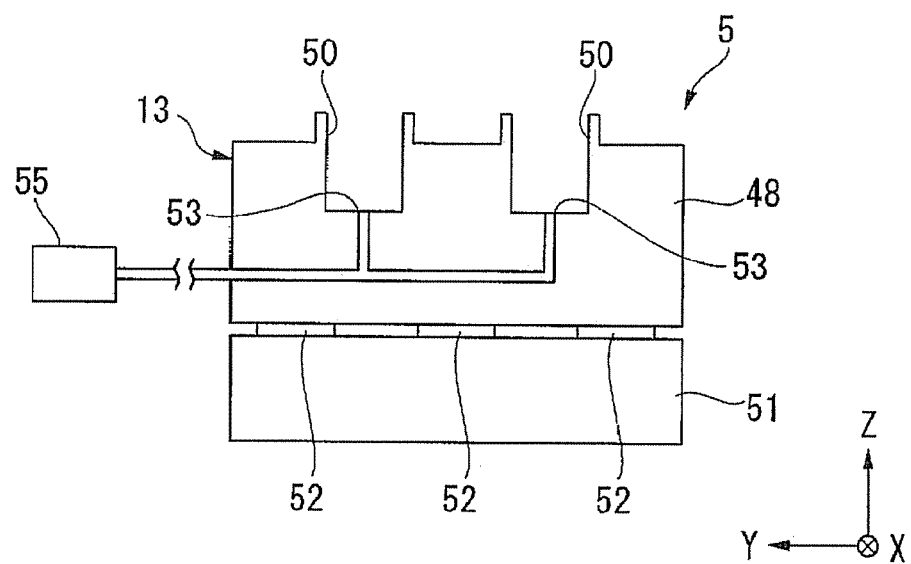
FIG. 6 is an illustration showing an example of a second moving body.
Figure 7:
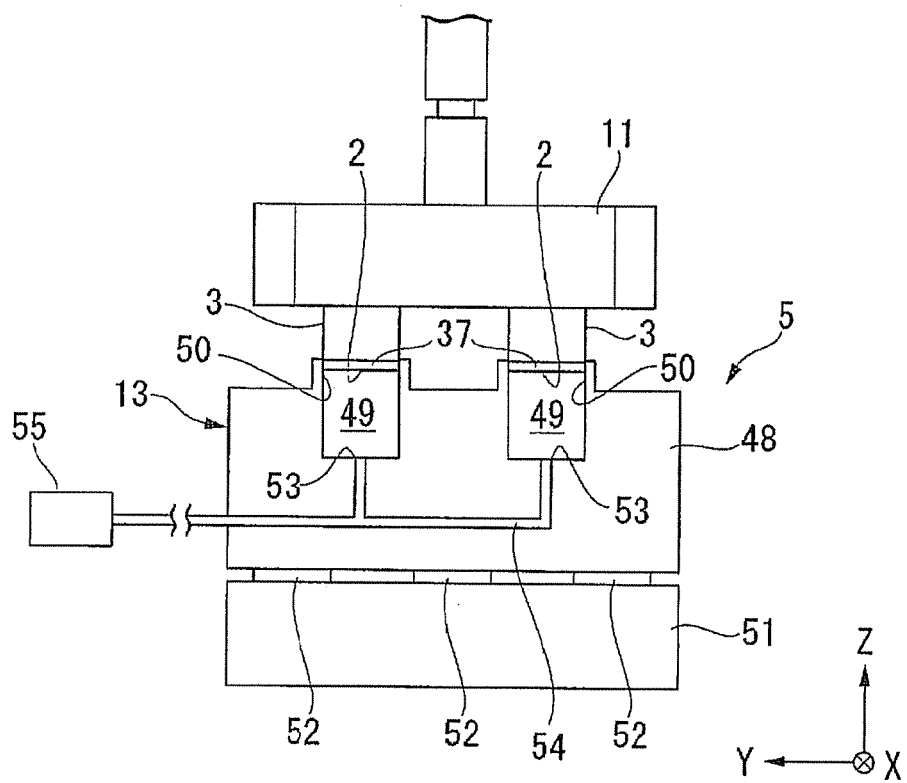
FIG. 7 is an illustration showing an example of an operation of the second moving body.

Next, the second moving body 5 will be described with reference to FIGS. 6 and 7. FIG. 6 is an illustration of the second moving body 5 when viewed from the −X side, and FIG. 7 is an illustration showing an operational example of the second moving body 5. The second moving body 5 includes the capping unit 13 for covering the ejection surface 2 of the ejection head 3.

The capping unit 13 includes a cap member 48 for covering the ejection surface 2 of the ejection head 3. The cap member 48 has an upper surface that can face the ejection head 3 and a cap portion 50 formed on the upper surface thereof and capable of forming a space 49 sealed between the ejection surface 2 thereof and the cap portion 50. The cap portion 50 includes a recessed portion (groove) formed on the upper surface of the cap member 48. The recessed portion allows the space 49 to be formed between the cap portion 58 and the ejection surface 2 thereof. The cap portion 50 includes a plurality of cap portions 50 so as to correspond to the plurality of ejection heads 3.

As shown in FIG. 7, in the capping unit 13, the entire ejection surface 2 of the ejection head 3 can be disposed inside the cap portion (recessed portion) 50. For example, the capping unit 13 forms the space 49 by contacting an upper end of an inner surface of the cap portion 50 with a side surface of the ejection head 3 (plate member 37) located outside the ejection surface 2.

Additionally, the capping unit 13 includes a vacuum hole 53 formed at a bottom surface of the cap portion (recessed portion) 50 and capable of vacuuming a fluid in the space 49 and a vacuuming system 55 connected to the vacuum hole 53 via a flow path 54.

The second moving body 5 has a second movable member 51 having the mover 24 of the linear motor. The cap member 48 of the capping unit 13 is mounted on the second movable member 51. Like the above-described first movable member 40, an air bearing is formed on a lower surface of the second movable member 51 facing the supporting surface 16 of the base member 17. The second movable member 51 is supported by the air bearing in such a manner as not to contact with the supporting surface 16. Like the first movable member 40 described above, on the lower surface of the second movable member 51 is formed a recessed portion where the guide member 18 can be arranged. The mover 24 is arranged on an inner surface of the recessed portion of the second movable member 51 facing the guide member 18. The driving unit 8 including the stator 22 and the mover 24 can move the second movable member 51 in the Y-axis direction. In addition, along with the movement of the member in the Y-axis direction, the cap member 48 of the capping unit 13 mounted thereon also moves together therewith in the Y-axis direction.

Furthermore, like the first moving body 4 above, between the second movable member 51 and the cap member 48 are arranged a plurality of actuators 52. The controlling unit 10 can move (slightly move) the cap member 48 on the second movable member 51 by controlling the actuators 52. In the present embodiment, the cap member 48 is slightly movable on the second movable member 51 by the actuators 52 in the directions of the six degrees of freedom, that is, in the directions of the X, Y, Z, θX, θY, and θZ axes.

In order to cover the ejection surface 2 of the ejection head 3 by using the cap member 48, the controlling unit 10 allows the driving unit 8 to move the second moving body 5 so as to locate the capping unit 13 of the second moving body 5 at the first position A1 facing the ejection surface 2 of the ejection head 3. Then, the controlling unit 10 allows the actuators 52 arranged between the second movable member 51 and the cap member 48 to adjust a positional relationship between the ejection surface 2 thereof and the cap member 50 of the cap member 48 so as to form the space 49 between the ejection surface 2 and the cap portion 50. For example, the controlling unit 10 allows the actuators 52 to move the cap member 51 in the +Z direction. As a result, the ejection surface 2 is disposed inside the cap portion 50, and then the upper end of the inner surface of the cap portion 50 contacts with the side surface of the ejection head 3 (plate member 37) outside the ejection surface 2, thereby forming the space 49.

In the state where the space 49 is formed between the ejection surface 2 of the ejection head 3 and the cap portion 50, the capping unit 13 drives the vacuuming system 55 to allow it to vacuum a fluid of the space 49 via the vacuum hole 53. The capping unit 13 can create a negative pressure in the space 49 by vacuuming the fluid (mainly a gas) of the space 49 via the vacuum hole 53, whereby the capping unit 13 can vacuum the functional liquid of the cavity 34 or the like inside the ejection head 3 via the ejection outlet 1. By vacuuming the fluid of the space 49, the capping unit 13 can generate a flow of the functional liquid directing toward the ejection outlet 1 inside the ejection head 3.

In this case, the capping unit 13 described by referring to FIGS. 6 and 7 has mainly a vacuuming mechanism for vacuuming the functional liquid in the ejection head 3. However, the capping unit 13 may have a mechanism (a moisture retention mechanism) for reducing dryness of the ejection surface 2 (ejection outlet 1). For example, the dryness of the ejection surface 2 can be reduced by arranging a wet porous material (a mesh material) inside the cap portion 50 such that the cap portion 50 with the wet porous material faces the ejection surface 2 of the ejection head 3. In short, the dryness of the ejection surface 2 can be reduced by arranging the wet porous material inside the space 49 formed by the ejection surface 2 and the cap portion 50.

Hereinafter, a capping process, as appropriate, represents a process in which the second moving body 5 is located at the first position A1, and the ejection surface 2 is arranged so as to face the cap portion 50, thereby covering the ejection surface 2 by the cap member 48.

Figure 8:
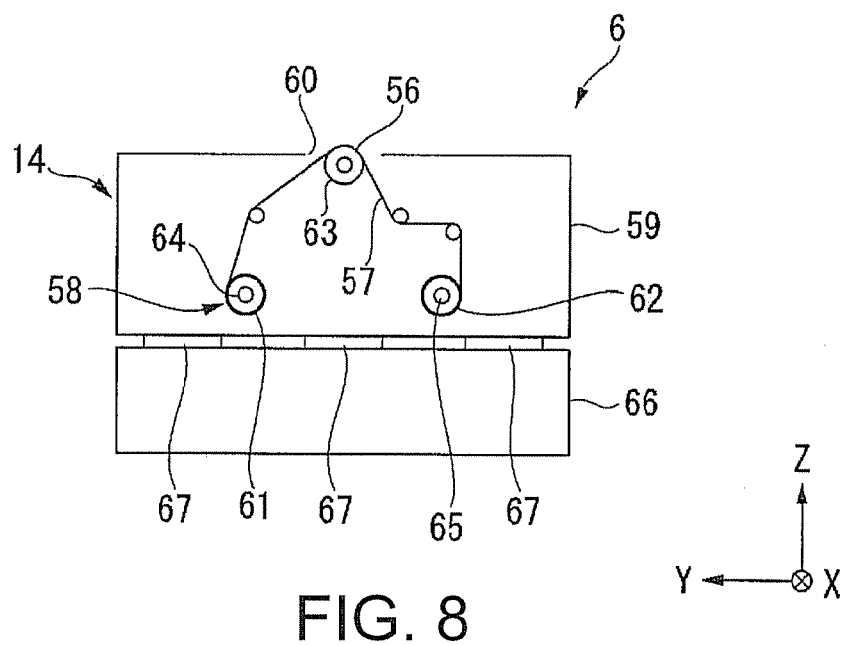
FIG. 8 is an illustration showing an example of a third moving body.
Figure 9:
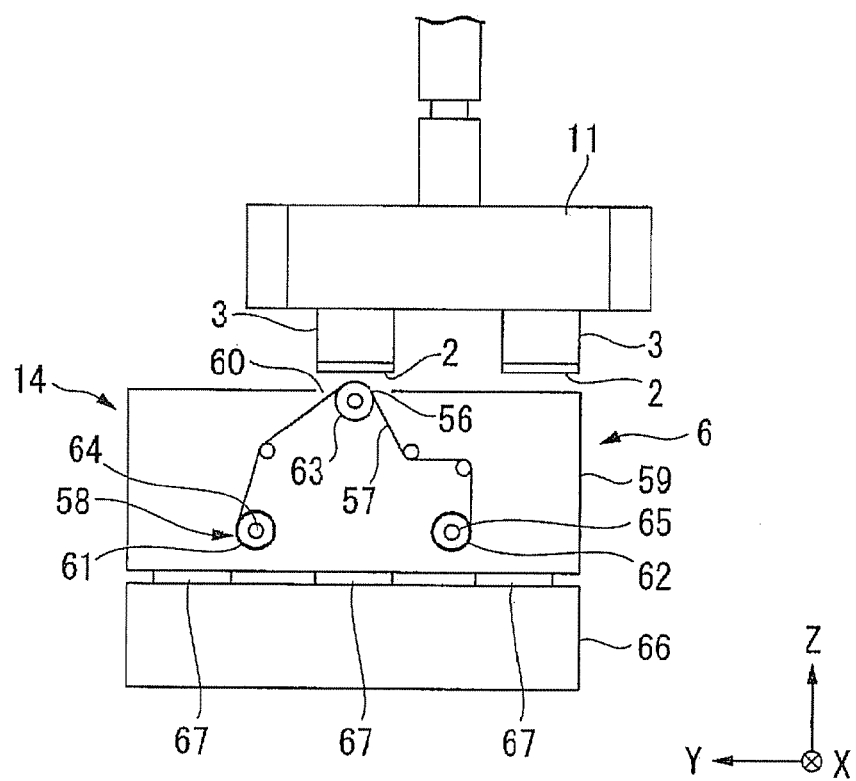
FIG. 9 is an illustration showing an example of an operation of the third moving body.

Next, the third moving body 6 will be described with reference to FIGS. 8 and 9. FIG. 8 shows the third moving body 6 when viewed from the −X side. FIG. 9 is an illustration showing an operational example of the third moving body 6. The third moving body 6 includes a wiping unit 14 for wiping off a foreign substance on the ejection surface 2 of the ejection head 3. The foreign substance on the ejection surface 2 thereof includes a liquid droplet. The liquid droplet includes at least one of the liquid droplet D of the functional liquid and a liquid droplet of the fluid contained in the immersing unit 15.

The wiping unit 14 includes a wiping member 57 having a wiping surface 56 movable relatively to the ejection surface 2 of the ejection head 3, while facing the ejection surface 2 thereof, a driving mechanism 58 for moving the wiping surface 56 of the wiping member 57, and a housing member 59 for containing the wiping member 57 and the driving mechanism 58.

At least a part of the wiping member 57, which is exposed (protruded) from an opening 60 formed in an upper surface of the housing member 59 that can face the ejection head 3, can face the ejection surface 2 of the ejection head 3. In the state where the ejection surface 2 thereof faces the wiping surface 56 of the wiping member 57, the wiping unit 14 moves the wiping surface 56 thereof with respect to the ejection surface 2, whereby the foreign substance adhering on the ejection surface 2 can be wiped off (removed) by the wiping surface 56.

In the present embodiment, the wiping member 57 is a sheet-shaped member. The wiping member 57 is made of a liquid absorbable material. For example, the wiping member 57 includes a nonwoven fabric. The wiping member 57 may be a fabric made of polyester or the like, for example. If the foreign substance adhering onto the ejection surface 2 of the ejection head 3 is a liquid droplet, the liquid droplet as the foreign substance can be favorably removed by using the wiping member 57 made of the liquid absorbable material.

The driving mechanism 58 for moving the wiping surface 56 of the wiping member 57 has a plurality of rollers rotating while supporting the wiping member 57. Specifically, the driving mechanism 58 has an unreeling roller 61 arranged inside the housing member 59 to unreel the sheet-shaped wiping member 57, a reeling roller 62 for reeling the wiping member 57, and a supporting roller 63 arranged at a position nearest to the ejection surface 2 of the ejection head 3 to support a surface opposite to the wiping surface 56 thereof facing the ejection surface 2. The unreeling roller 61 and the reeling roller 62, respectively, are rotated by the actuators 64 and 65, respectively, such as rotary motors. The wiping unit 14 controls the actuators 64 and 65 such that the wiping surface 56 thereof moves (travels) at a predetermined speed.

Additionally, the driving mechanism 58 includes a guide roller for guiding the movement (traveling) of the wiping member 57 and a tension roller capable of adjusting a tension of the wiping member 57.

The third moving body 6 has a third movable member 66 having the mover 25 of the linear motor. The housing member 59 of the wiping unit 14 is mounted on the third movable member 66. Like the first movable member 40 described above, on a lower surface of the third movable member 66 facing the supporting surface 16 of the base member 17, there is formed an air bearing. The third movable member 66 is supported by the air bearing in such a manner as not to contact with the supporting surface 16. In addition, like the above first movable member 40, on the lower surface of the third movable member 66 is formed a recessed portion where the guide member 18 can be arranged. The mover 25 is arranged on an inner surface of the recessed portion of the third movable member 66 facing the guide member 18. The driving unit 8 including the stator 22 and the mover 25 can move the third movable member 66 in the Y-axis direction. Along with the movement of the member in the Y-axis direction, the housing member 59 of the wiping unit 14 mounted thereon also moves together therewith in the Y-axis direction.

Furthermore, like the first moving body 4 above, between the third movable member 66 and the housing member 59 are arranged a plurality of actuators 67. The controlling unit 10 can move (slightly move) the housing member 59 on the third movable member 66 by controlling the actuators 67. In the present embodiment, the actuators 67 can move the housing member 59 on the third movable member 66 in the directions of the six degrees of freedom, that is, in the directions of the X, Y, Z, θX, θY, and θZ axes. Along with the movement of the housing member 59, the driving mechanism 58 including the wiping member 57 and the rollers in the wiping unit 14 moves together therewith on the third movable member 66.

In order to wipe off the foreign substance on the ejection surface 2 of the ejection head 3 by the wiping member 57, the controlling unit 10 allows the driving unit 8 to move the third moving body 6 to locate the wiping unit 14 of the third moving body 6 at the first position A1 facing the ejection surface 2 thereof. Then, the controlling unit 10 allows the actuators 67 arranged between the third movable member 66 and the housing member 59 to adjust the positional relationship between the ejection surface 2 thereof and the wiping surface 56 of the wiping member 57 at a portion supported by the supporting roller 63 so as to wipe off the foreign substance on the ejection surface 2 by the wiping surface 56. For example, the controlling unit 10 allows the actuators 67 to move the housing member 59 in the Z-axis direction. Along with the movement of the housing member 59 in the Z-axis direction, the supporting roller 63 supporting the wiping member 57 also moves together therewith in the Z-axis direction. The controlling unit 10 allows the actuators 67 to adjust a distance (gap) in the Z-axis direction between the ejection surface 2 of the ejection head 3 and the wiping surface 56 of the wiping member 57 at the portion supported by the supporting roller 63. Then, the controlling unit 10 drives the unreeling roller 61 and the reeling roller 62 such that the wiping surface 56 moves (travels) with respect to the ejection surface 2. Thereby, the wiping unit 14 can wipe off (remove) the foreign substance adhering to the ejection surface 2.

Hereinafter, a wiping process, as appropriate, represents a process in which the third moving body 6 is located at the first position A1 and the ejection surface 2 is arranged so as to face the wiping surface 56, thereby wiping off the foreign substance on the ejection surface 2.

Figure 10:
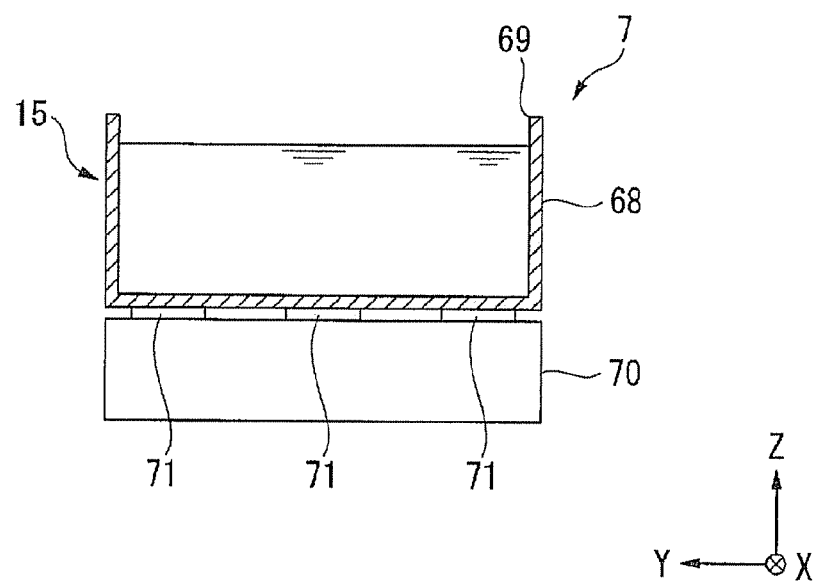
FIG. 10 is an illustration showing an example of a fourth moving body.
Figure 11:
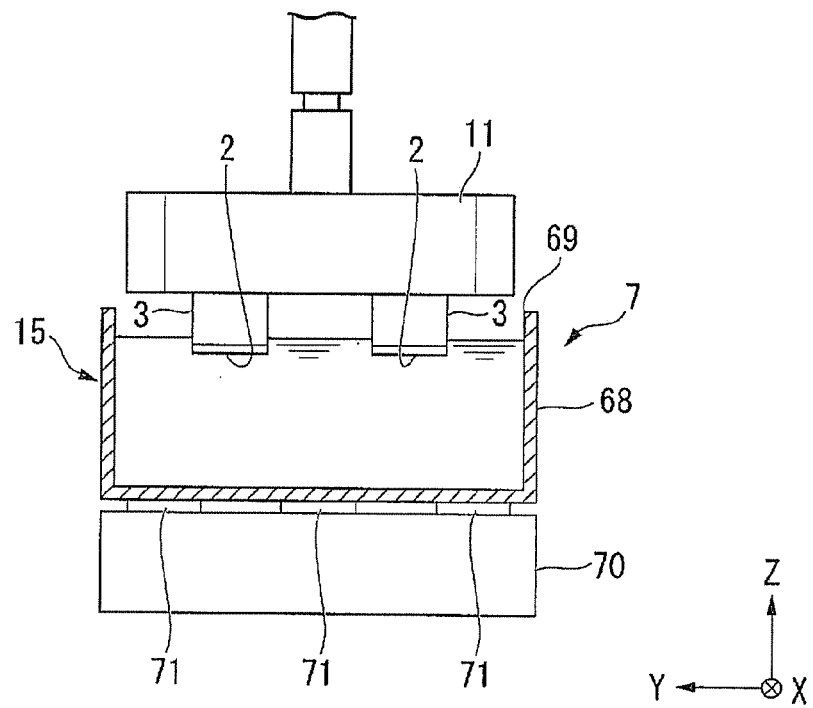
FIG. 11 is an illustration showing an example of an operation of the fourth moving body.

Next, the fourth moving body 7 will be described with reference to FIGS. 10 and 11. FIG. 10 shows the fourth moving body 7 when viewed from the −X side. FIG. 11 is an illustration showing an operational example of the fourth moving body 7. The fourth moving body 7 includes the immersing unit 15 for immersing at least a part of the ejection head 3 in a liquid other than the functional liquid.

The immersing unit 15 includes a container 68 for containing the liquid. The liquid contained in the immersing unit 15 includes at least one of a cleaning liquid for cleaning at least a part of the ejection head 3 and a cooling liquid for cooling at least a part thereof. At a top of the container 68 of the immersing unit 15 is formed an opening 69. The ejection head 3 can be moved (put) in a space inside the container 68 via the opening 69. The controlling unit 10 can clean or cool at least a part of the ejection head 3, such as the ejection surface 2 or the ejection outlet 1, by disposing the ejection head 3 in the space inside the container 68 of the immersing unit 15 to immerse the head in the liquid.

For example, the liquid in the immersing unit 15 may be a dispersion medium of the functional liquid. The dispersion medium used in the present embodiment is a liquid mainly made of water. Thus, the liquid of the immersing unit 15 may be water or a liquid mainly containing water. Thereby, at least a part of the ejection head 3, such as the ejection surface 2 or the ejection outlet 1, can be cleaned or cooled.

The fourth moving body 7 includes a fourth movable member 70 having the mover 26 of the linear motor. The container 68 of the immersing unit 15 is mounted on the fourth movable member 70. Like the above-described first movable member 40, an air bearing is formed on a lower surface of the fourth movable member 70 facing the supporting surface 16 of the base member 17. The fourth movable member 70 is supported by the air bearing in such a manner as not to contact with the supporting surface 16. Additionally, like the first movable member 40 described above, on a lower surface of the fourth movable member 70 is formed a recessed portion where the guide member 18 can be arranged. The mover 26 is arranged on an inner surface of the recessed portion of the fourth movable member 70 facing the guide member 18. The driving unit 8 including the stator 22 and the mover 26 can move the fourth movable member 70 in the Y-axis direction. In addition, along with the movement of the member 70 in the Y-axis direction, the container 68 of the immersing unit 15 mounted thereon also moves together therewith in the Y-axis direction.

Furthermore, like the first moving body 4 above, a plurality of actuators 71 are arranged between the fourth movable member 70 and the container 68. The controlling unit 10 can move (slightly move) the container 68 on the fourth movable member 70 by controlling the actuators 71. In the present embodiment, the actuators 71 can move the container 68 on the fourth movable member 70 in the directions of the six degrees of freedom, that is, in the directions of the X, Y, Z, θX, θY, and θZ axes. Along with the movement of the container 68, the surface of a liquid contained in the container 68 of the immersing unit 15 also moves together therewith on the fourth movable member 70.

In order to immerse at least a part of the ejection head 3 in the liquid of the immersing unit 15, the controlling unit 10 allows the driving unit 8 to move the fourth moving body 7 so as to locate the immersing unit 15 of the fourth moving body 7 at the first position A1 facing the ejection surface 2 of the ejection head 3. Then, the controlling unit 10 allows the actuators 71 arranged between the fourth movable member 70 and the container 68 to adjust a positional relationship between the ejection surface 2 thereof and the container 68 (liquid surface) such that at least the ejection surface 2 thereof is immersed in the liquid of the container 68. For example, the controlling unit 10 allows the actuators 71 to move the container 68 in the +Z direction. Along with the movement of the container 68 in the +Z direction, the surface of the liquid of the container 68 moves close to the ejection head 3. Thereby, the immersing unit 15 allows at least a part of the ejection head 3 to be immersed in the liquid. Then, the controlling unit 10 allows the actuators 71 to move the container 68 in the −Z direction to separate the ejection head 3 from the liquid thereof.

Hereinafter, an immersing process, as appropriate, represents a process in which the fourth moving body 7 is located at the first position A1 and the ejection surface 2 is arranged so as to face the liquid surface of the container 68, thereby immersing the at least a part of the ejection head 3 in the liquid of the container 68.

Furthermore, in the description below, a maintenance process, as appropriate, represents a process of performing maintenance of the ejection head 3. The maintenance process includes at least one of the capping process, the wiping process and the immersing process described above.

Figure 12:
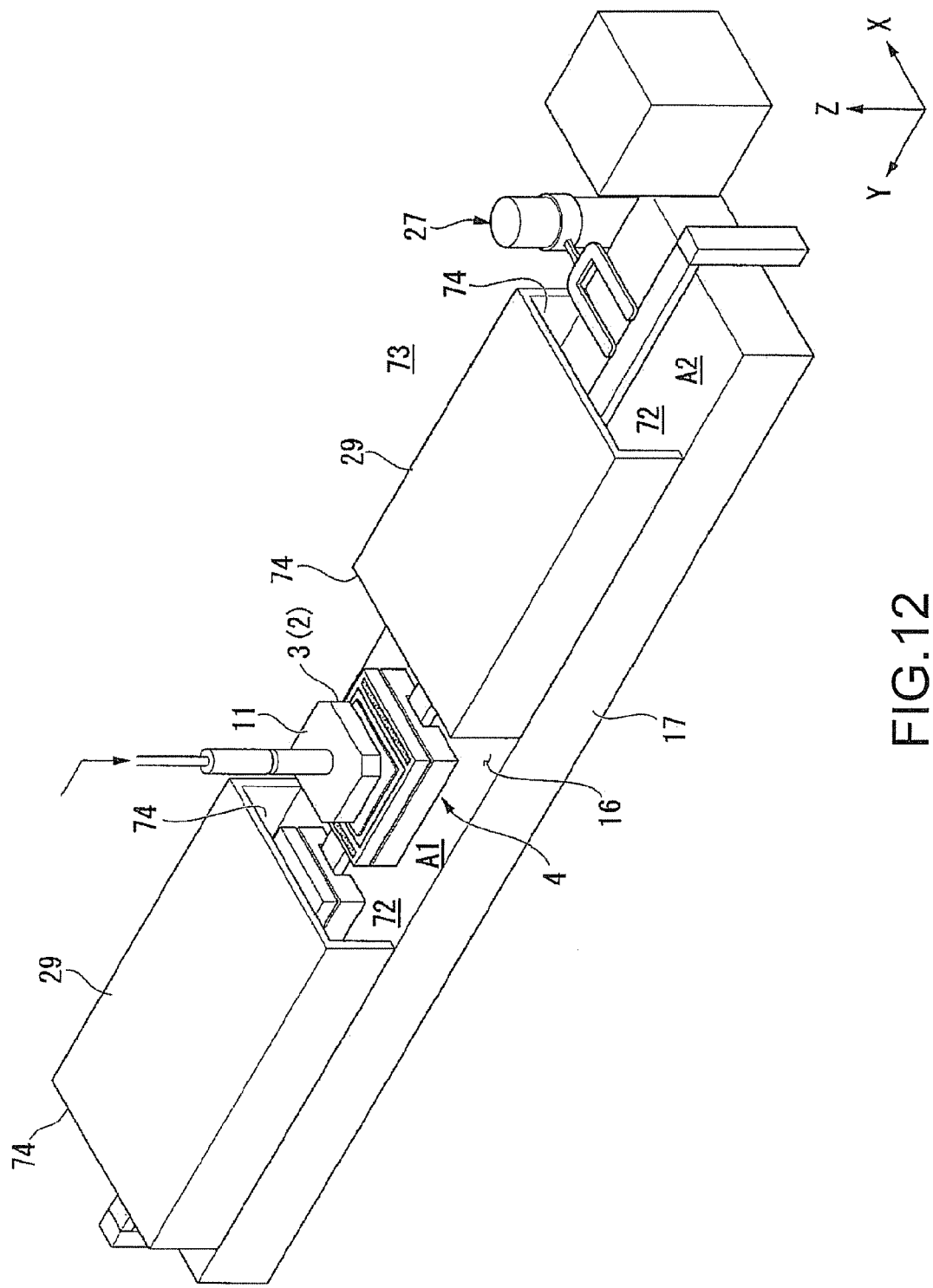
FIG. 12 is a perspective view of an insulating member.
Figure 13:
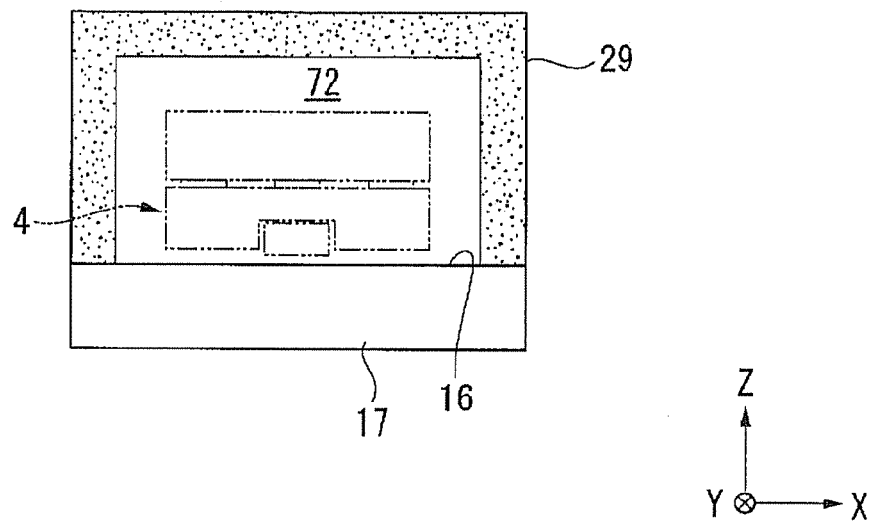
FIG. 13 is a side surface view of the insulating member.

Next, the insulating member will be described with reference to FIGS. 12 and 13. FIG. 12 is a perspective view of the insulating member 29, and FIG. 13 is a side surface view of the insulating member 29 when viewed from the −Y side.

The insulating member 29 is arranged on at least a part of a moving route of each of the moving bodies 5, 6 and 7 in addition to the first moving body 4. The insulating member 29 prevents the heat of the first moving body 4 from being diffused to the peripheral area. As described above, the first moving body 4 (the holder member 42) includes the heater 47 for heating the substrate P. The insulating member 29 prevents the heat emitted from the first moving body 4 with the heater 47 from being diffused to the peripheral area.

The insulating member 29 is arranged on the moving route of each of the moving bodies 4 to 7, except for the first position A1. In other words, the insulating member 29 is not arranged at the first position A1 where the processes by using the ejection head 3 are performed. Accordingly, the processes (such as the pattern formation process and the maintenance process) performed through the cooperation of the ejection head 3 with the moving bodies 4 to 7 are not disturbed.

Additionally, the insulating member 29 is not arranged either at the second position A2 where the process by using the substrate carrying unit 27 is performed. Specifically, in the present embodiment, the insulating member 29 is arranged at a position on the moving route of the moving bodies 4 to 7, which is neither the first nor the second positions A1 and A2. The arrangement can ensure that the substrate P is carried to the first moving body 4 located at the second position A2 and carried out therefrom by the substrate carrying unit 27.

In the present embodiment, the insulating member 29 is arranged so as to surround the moving bodies 4 to 7 at a position apart from each thereof on the base member 17. The insulating member 29 forms an inside space 72 where the moving bodies 4 to 7 are movable. More specifically, the insulating member 29 forms the inside space 72 where the moving bodies 4 to 7 can be moved (arranged) between the member and the supporting surface 16 of the base member 17. The insulating member 29 prevents heat of the first moving body 4 located in the inside space 72 from being diffused to an outside space 73. The outside space 73 is a space outside the insulating member 29, relative to the inside space 72 thereof. In the present embodiment, the outside space 73 includes a space between the chamber main body 30 (the inner surface of the chamber main body 30) and the insulating member 29 (an outer surface of the insulating member 29).

The air-conditioning unit 31 of the chamber unit 32 adjusts at least a temperature of the outside space 73. Thereby, the units and the members arranged in the chamber main body 30 are secured in a desired environment (temperature).

The insulating member 29 has insulating properties and is made of a material capable of preventing the of heat of the first moving body 4 arranged in the inner space 72 from being diffused to the outside space 73. In the present embodiment, for example, the insulating member 29 is made of a synthetic resin having insulating properties, such as styrofoam or foamed urethane.

The insulating member 29 of the present embodiment has a tunnel shape. At opposite ends thereof in the Y-axis direction, there is formed an opening (a gateway) 74, through which the moving bodies 4 to 7 can pass. The opening 74 is formed such that the inside space 72 formed by the insulating member 29 communicates with the outside space 73.

Figure 14:
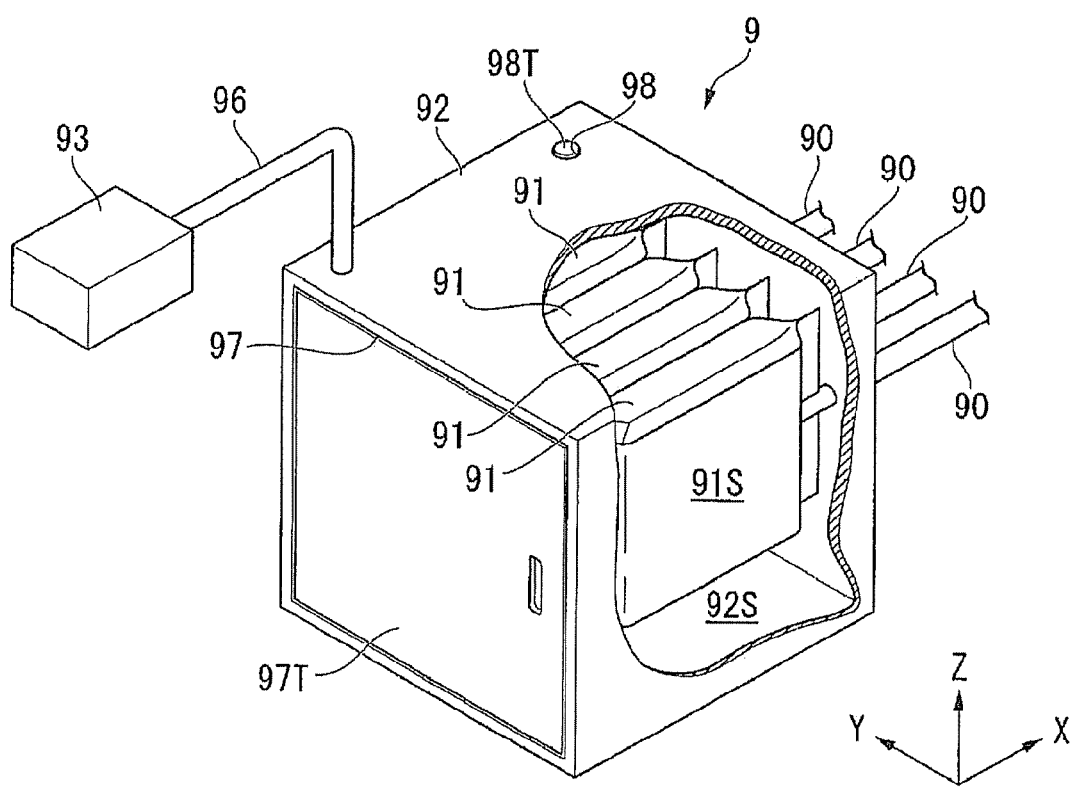
FIG. 14 is a perspective view showing an example of a functional liquid containing unit according to the first embodiment.

Next, the functional liquid containing unit 9 will be described with reference to FIGS. 14 and 15. FIG. 14 is a perspective view of the functional liquid containing unit 9, and FIG. 15 is a side sectional view thereof.

Figure 15:
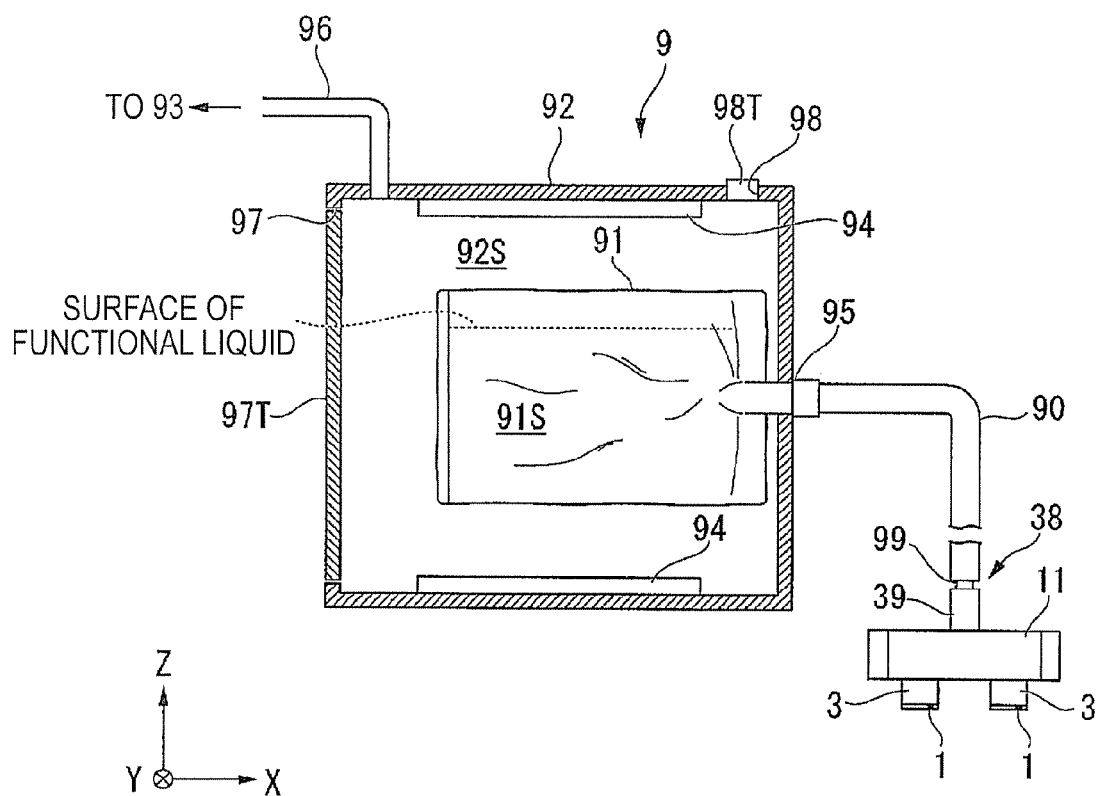
FIG. 15 is a side sectional view showing an example of the functional liquid containing unit according to the first embodiment.

In FIGS. 14 and 15, the functional liquid containing unit 9 is connected to the ejection head 3 via the flow path and includes a first container 91 for forming a first space 91S for containing the functional liquid that is to be supplied to the ejection head 3, a second container 92 for containing the first container 91 and forming a second space 92S between the first container 91 and the second container 92, a pressure regulator 93 for adjusting a pressure of the second pressure 92S, and a temperature regulator 94 for adjusting a temperature of the functional liquid in the first container 91. The first container 91 is made of a flexible film (thin film). In the present embodiment, the first container 91 is a package container made of a plastic thin sheet. The first container 91 is deformed in accordance with an operation of the pressure regulator 93. The first space 91S of the first container 91 is an approximately sealed space.

The second container 92 is formed by combining a plurality of hard plate-like members. For example, the second container 92 is a box-like member formed by combining a plurality of hard plate-like members made of metal, plastic or the like.

In the present embodiment, the first container 91 includes a plurality of first containers 91 and is arranged inside the second container 92. For example, the first containers 91 are arranged so as to correspond to the ejection heads 3.

The flow path for connecting the first space 91S of the first container 91 to the ejection head 3 is formed by a piping system including a tube member 90. The tube member 90 forms the flow path through which the functional liquid flows. A first end of the flow path of the tube member 90 is connected to a connecting mechanism 95 provided in the second container 92, whereas a second end thereof is connected to the retaining unit 38. Corresponding to the plurality of first containers 91, the tube member 90 includes a plurality of tube members 90 and the connecting mechanism 95 includes a plurality of connecting mechanisms 95. Each of the connecting mechanisms 95 has a flow path thereinside and can connect the first end of the flow path of the tube member 90 to the first space 91S of the first container 91 arranged in the inside space of the second container 92. The retaining unit 38 has a flow path thereinside and can connect the second end of the flow path of the tube member 90 to the flow path of the inside of the ejection head 3 such as the cavity 34. In other words, the first space 91S of the first container 91 is connected to the flow path of the inside of the ejection head 3 via the flow path of the connecting mechanism 95, the flow path of the tube member 90, and the flow path of the retaining unit 38. Accordingly, the functional liquid contained in the first space 91S of the first container 91 can be supplied to the ejection outlet 1 of the ejection head 3 via the flow path of the connecting mechanism 95, that of the tube member 90, that of the retaining unit 38, and that of the inside of the ejection head 3.

Additionally, the liquid droplet ejection apparatus IJ includes a connecting unit 99 for detachably connecting the ejection head 3 to the flow path between the first space 91S and the ejection head 3. In the present embodiment, the connecting unit 99 is provided at the retaining unit 38 to detachably connect the second end of the flow path of the tube member 90 to an upper end of the supporting mechanism 39. The connecting unit 99 allows the retaining unit 38 including the ejection head 3 (the supporting mechanism 39 and the carriage member 11) to be detached from the flow path formed by the tube member 90 in the flow path between the first space 91S and the ejection head 3.

The pressure regulator 93 adjusts the pressure of the second space 92S in accordance with a positional relationship between a surface (interface) of the functional liquid of the first container 91 and the ejection outlet 1 of the ejection head 3. The pressure regulator 93 is connected to the second space 92S via the flow path formed by the tube member 96. The pressure regulator 93 includes a vacuuming system and can depressurize the second space 92S by vacuuming a gas (air) in the space. Additionally, the pressure regulator 93 includes a gas supplying system and can pressurize the second space 92S by supplying a gas (air) thereto.

As described above, in the present embodiment, the pressure near the ejection outlet 1 is set to an approximately atmospheric level by the chamber device 32. The pressure regulator 93 can reduce the pressure of the second space 92S lower than at least an atmospheric pressure by using the vacuuming system and can increase the pressure thereof higher than at least the atmospheric pressure by using the gas supplying system.

In the present embodiment, the surface of the functional liquid in the first container 91 is maintained at a position (on the +Z side) upper than the ejection outlet 1 of the ejection head 3. The pressure regulator 93 depressurizes the second space 92S. Specifically, the pressure regulator 93 reduces the pressure of the second space 92S lower than at least the pressure (the atmospheric pressure) near the ejection outlet 1 thereof.

At least a part of the temperature regulator 94 is located on an inner surface of the second container 92 facing the first container 91 and can adjust the temperature of the first container 91 (the functional liquid of the first container 91) arranged in the inside space of the second container 92. The temperature regulator 94 includes both of a heating mechanism and a cooling mechanism capable of heating and cooling the first container 91 (the functional liquid of the first container 91) arranged in the inside space of the second container 92.

As described above, in the present embodiment, the temperature near the ejection outlet 1 is set to an approximately room temperature (e.g. 22 degrees C.) by the chamber unit 32. The temperature regulator 94 can increase the temperature of the functional liquid of the first container 91 to higher than at least 22 degrees C. by using the heating mechanism, and can reduce the temperature of the functional liquid thereof to lower than at least 22 degrees C. by using the cooling mechanism.

In the present embodiment, in accordance with physical properties of the functional liquid of the first container 91, the temperature regulator 94 cools the functional liquid of the container arranged in the inside space of the second container 92 to reduce the temperature of the liquid thereof to lower than at least the temperature (22 degrees C.) near the ejection outlet 1 of the ejection head 3. In the embodiment, for example, the temperature regulator 94 adjusts the temperature of the functional liquid thereof to 10 degrees C. In other words, in the present embodiment, the second container 92 with the at least a part of the temperature regulator 94 serves as a refrigerator. For example, the second container 92 may be made of a material having insulating properties, such as styrofoam or urethane foam.

At a first position of the second container 92 is formed a first opening 97 for allowing the inside space (second space 92S) of the second container 92 to communicate with the outside space thereof (the atmospheric space). At the first opening 97 is arranged an open/close door 97T for opening and closing the first opening 97. The first opening 97 allows the first container 91 to pass through between the spaces inside and outside the second container 92 and has dimensions sufficient to pass the first container 91 through. Accordingly, the open/close door 97T is driven to open the first opening 97, through which the first container 91 can be taken out from and put into the inside space of the second container 92, whereby the first container 91 can be exchanged with a new one. Furthermore, the open/close door 97T is driven to close the first opening 97, whereby the inside space (second space 92S) of the second container 92 can be sealed such that the pressure regulator 93 can adjust the pressure.

In addition, at a second position of the second container 92 is formed a second opening 98 for allowing the inside space (second space 92S) of the second container 92 to communicate with the outside space (atmospheric space). At the second opening 98 is arranged an open/close cover 98T for opening and closing the second opening 98. The second opening 98 opens the inside space of the second container 92 to the atmosphere. For example, even in a state where the second space 92S is depressurized, when the open/close cover 98T is removed to open the second opening 98, the second space 92S can communicate with the atmospheric space via the second opening 98, so that the second space 92S can be open to the atmosphere. Thereby, for example, even in a state where the first opening 97 is closed, the open/close door 97T can easily be driven to open, so that the first container 91 can be smoothly exchanged. In addition, since the open/close cover 98T is disposed at the second opening 98 to close the second opening 98, the inside space (second space 92S) of the second container 92 can be sealed such that the pressure regulator 93 can adjust the pressure.

In other words, the inside space (second space 92S) of the second container 92 becomes an approximately sealed space when closing the first and the second openings 97 and 98 by driving the open/close door 97T and the open/close cover 98T, respectively.

Figure 16A:
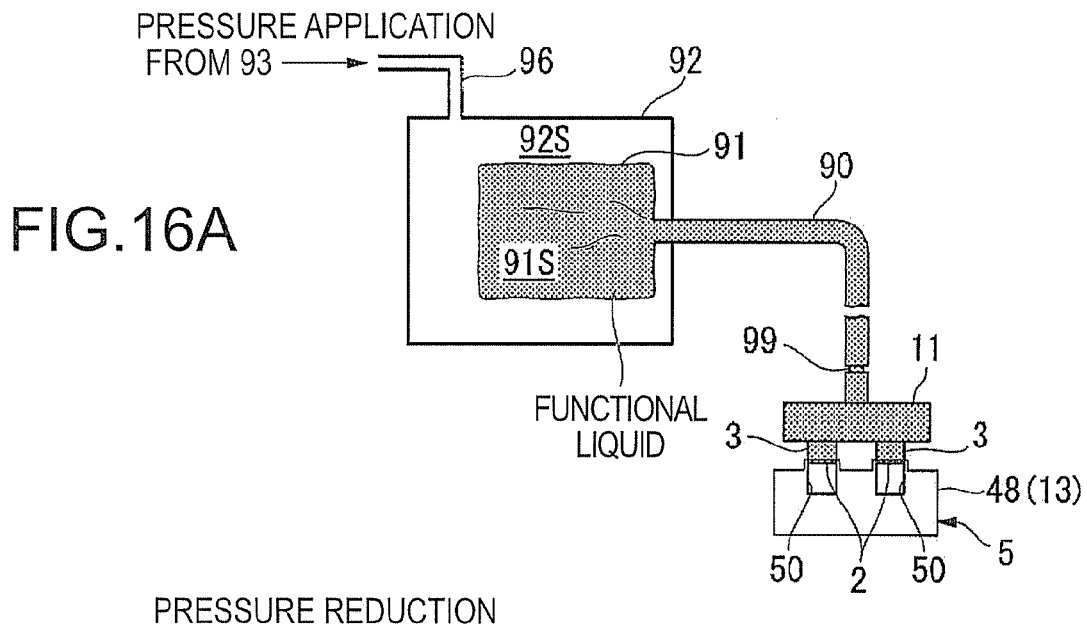
FIGS. 16A, 16B, and 16C are illustrations for explaining an example of an operation of the liquid droplet ejection apparatus according to the first embodiment.
Figure 16B:
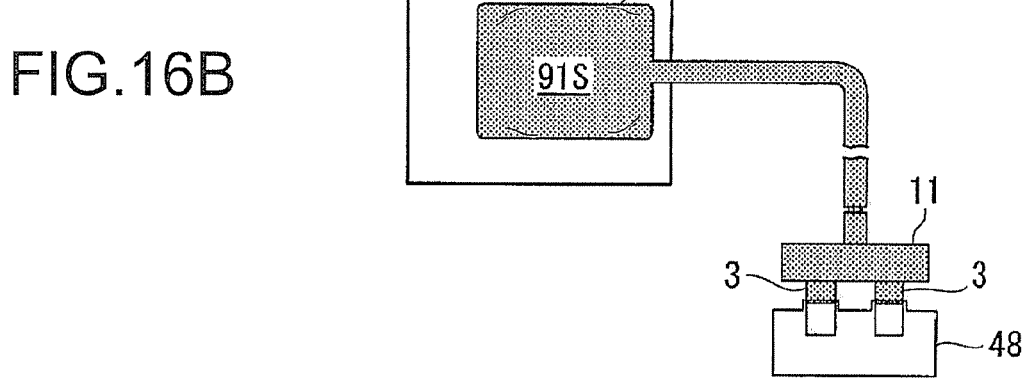
Figure 16C:
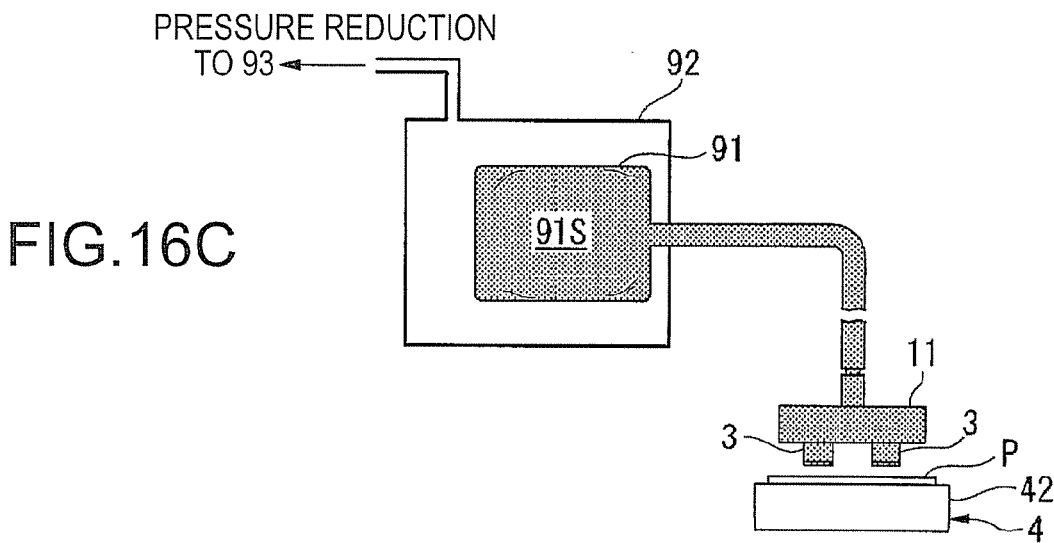
Figure 17:
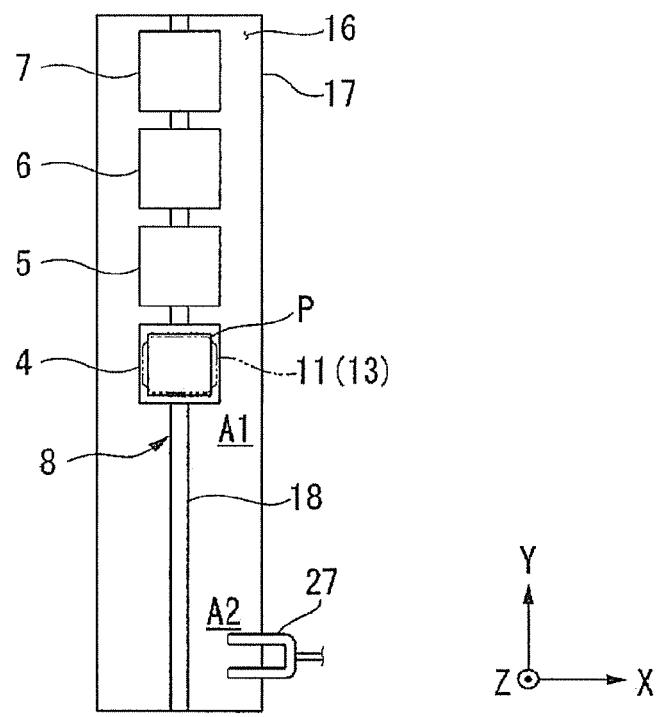
FIG. 17 is an illustration for explaining an example of another operation of the liquid droplet ejection apparatus according to the first embodiment.
Figure 18:
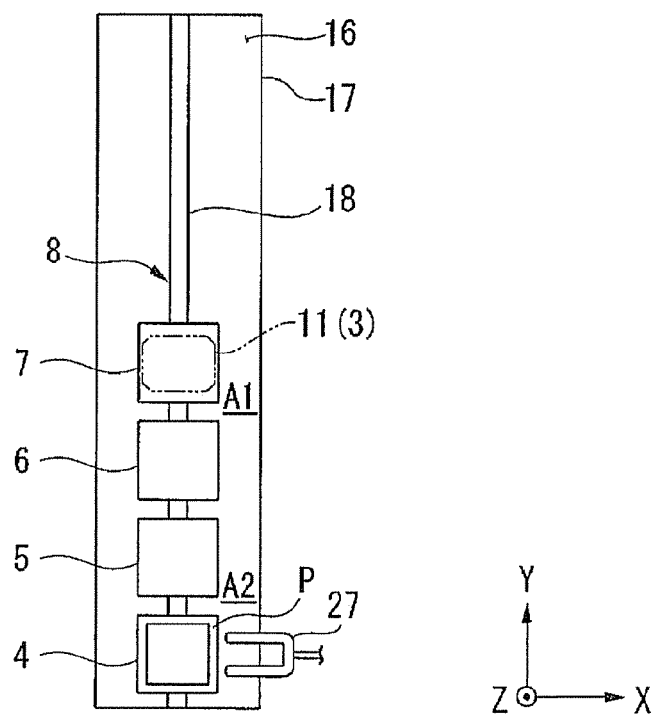
FIG. 18 is an illustration for explaining an example of another operation of the liquid droplet ejection apparatus according to the first embodiment.
Figure 19A:
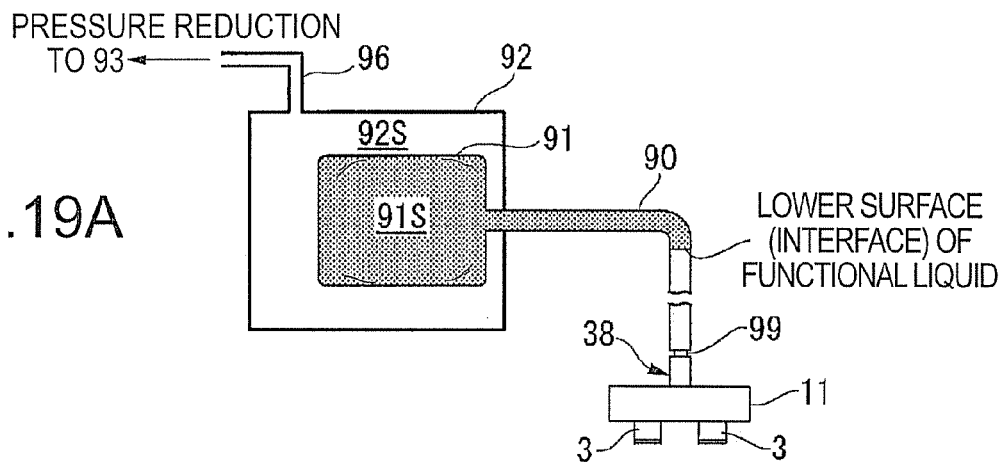
FIGS. 19A, 19B and 19C are illustrations for explaining an example of another operation of the liquid droplet ejection apparatus according to the first embodiment.
Figure 19B:
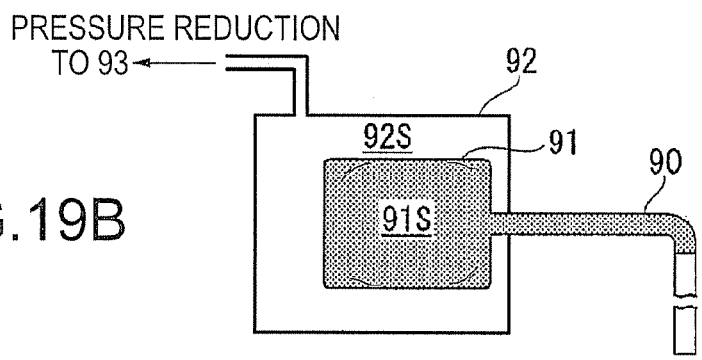
Figure 19C:
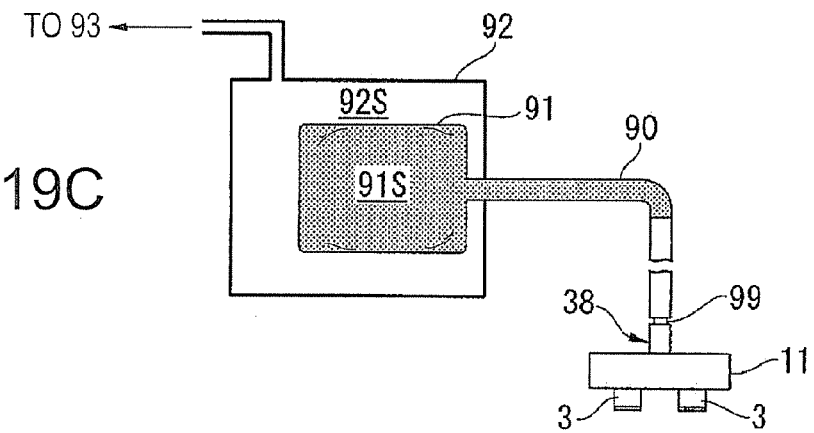

Next will be described an example of a method for manufacturing a device by using the liquid droplet ejection apparatus IJ having the above-described structure by referring to schematic diagrams of FIGS. 16A to 19C. The following description will exemplify an initial filling operation in which the ejection apparatus IJ fills the ejection head 3 in its initial state with the functional liquid; a liquid droplet ejection operation in which, after the initial filling operation, the ejection apparatus IJ ejects the liquid droplet D of the functional liquid from the ejection outlet 1 to manufacture a device; a maintenance operation of performing maintenance of the ejection head 3; and an ejection head exchanging operation of exchanging the ejection head 3. FIGS. 16A, 16B, and 16C are schematic diagrams showing an example of the initial filling operation. FIG. 17 is a schematic diagram showing an example of the liquid droplet ejection operation; FIG. 18 is a schematic diagram showing an example of the maintenance operation; and FIGS. 19A, 19B, and 19C are schematic diagrams showing an example of the ejection head exchanging operation.

Initial Filling Operation

First, the initial filling operation will be performed. The operation includes an operation of filling the ejection head 3 in its initial state with the functional liquid. The initial state of the ejection head 3 includes a state where the flow path of the inside of the ejection head 3, such as the cavity 34, is not filled with the functional liquid (a state where the flow path thereinside is vacant).

In the functional liquid containing unit 9, the first container 91 filled with the functional liquid is contained in the inside space of the second container 92 via the first opening 97. In the inside space thereof is arranged a part of the connecting mechanism 95, which is connected to the first container 91. Then, when the first opening 97 is closed by the open/close door 97T, the second opening 98 is also closed by the open/close cover 98T. Thereby, the second space 92S results in being sealed. Additionally, the temperature regulator 94 cools the functional liquid of the first container 91 contained in the second container 92.

After the first container 91 is contained in the second space 92S in the sealed state, the controlling unit 10 drives the pressure regulator 93. In addition, the controlling unit 10 allocates the second moving body 5 at the first position A1 to allow the ejection surface 2 of the ejection head 3 to face the cap portion 50, thereby covering the ejection surface 2 by the cap member 48.

As shown in FIG. 16A, the controlling unit 10 allows the pressure regulator 93 to pressurize the second space 92S, as well as allows the capping unit 13 to vacuum the ejection outlet 1 of the ejection head 3, as described by referring to FIG. 7 and the like. As described above, the first container 91 is made of the flexible film deformed in accordance with the operation of the pressure regulator 93. With the operation of the pressure regulator 93, when the pressure of the second space 92S is changed, the first container 91 is deformed in accordance with the pressure of the second space 92S. The pressure of the first space 91S of the first container 91 changes in accordance with the deformation of the first container 91. In other words, in the present embodiment, along with the pressure of the second space 92S changed in accordance with the operation of the pressure regulator 93, the pressure of the first space 91S is also changed. Specifically, when the pressure of the second space 92S increases, the first container 91 is deformed in accordance with the increase in the pressure thereof, thereby increasing the pressure of the first space 91 containing the functional liquid.

When the first space 91S is pressurized by pressurizing the second space 92S, the controlling unit 10 can smoothly supply the functional liquid contained in the first space 91S to the ejection head 3 via the flow path of the tube member 90 or the like. In addition, in parallel with the pressurization to the first space 91S, the capping unit 13 performs vacuuming of the ejection outlet 1. Thereby, the controlling unit 10 can quickly and smoothly fill the vacant flow path of the inside of the ejection head 3 with the functional liquid.

The functional liquid, which is being cooled in the first space 91S by the temperature regulator 94, is heated during a time when it flows through the flow path such as the tube member 90 toward the ejection head 3. By the time when the functional liquid reaches the ejection head 3 (ejection outlet 1), the temperature of the functional liquid is adjusted to an approximately room temperature (e.g. 22 degrees C.).

After the flow path of the inside of the ejection head 3 such as the cavity 34 has been filled with the functional liquid, as shown in the schematic diagram of FIG. 16B, the controlling unit 10 allows the pressure regulator 93 to depressurize the second space 92S. When the pressure of the second space 92S is reduced, the first container 91 is deformed along with the reduction of the pressure of the second space 92S, thereby reducing the pressure of the first space 91 containing the functional liquid.

Depressurizing the first space 91S by depressurizing the second space 92S allows a meniscus of the functional liquid in the ejection outlet 1 to be maintained. Accordingly, the ejection outlet 1 of the ejection head 3 is set so as to favorably eject the liquid droplet D, while suppressing a leakage of the functional liquid. In this manner, the controlling unit 10 adjusts (reduces) the pressure of the second space 92S (first space 91S) such that the meniscus of the functional liquid at the ejection outlet 1 is maintained in the desired state.

Additionally, according to needs, the controlling unit 10 appropriately performs a capping process by the capping unit 13, a wiping process by the wiping unit 14, and an immersing process by the immersing unit 15, while depressurizing the second space 92S (first space 91S). Then, after terminating the maintenance process including the capping process, the wiping process, and the immersing process, as shown in FIG. 16C, the controlling unit 10 allocates the first moving body 4 retaining the substrate P at the first position A1 and starts ejecting the liquid droplet D of the functional liquid to manufacture the device.

Liquid Droplet Ejection Operation

FIG. 17 is a schematic diagram showing a state where the first moving body 4 retaining the substrate P is allocated at the first position A1. The controlling unit 10 allocates the first moving body 4 retaining the substrate P at the first position A1 facing the ejection surface 2 of the ejection head 3. Then, the controlling unit 10 controls the controller 12 and the driving unit 8 to eject (supply) the liquid droplet D on the substrate P from the ejection outlet 1 of the ejection head 3, while moving the substrate P of the first moving body 4 in the Y-axis direction with respect to the ejection outlet 1 thereof. Consequently, a pattern is formed on the substrate P by the functional liquid D. Next, the controlling unit 10 allows the heater 47 to heat the substrate P, while the liquid droplet D is being ejected on the substrate P.

In the present embodiment, among the ejection outlets 1 of the ejection heads 3, a distance between the ejection outlet 1 positioned on the most +X side and the ejection outlet 1 positioned on the most −X side is approximately equal to a size of the substrate P in the X-axis direction. Accordingly, when the liquid droplet ejection apparatus IJ ejects (supplies) the liquid droplet D on the substrate P from the ejection outlet 1, while moving the substrate P of the first moving body 4 in the Y-axis direction with respect to the ejection outlet 1, it can supply the liquid droplet D on an almost entire surface of the substrate P by moving the substrate P in the Y-axis direction only once.

Meanwhile, the ejection apparatus IJ may repeat the foregoing liquid droplet ejection (supplying) operation a plurality of times. For example, the ejection apparatus IJ may repeat a plurality of times the liquid droplet ejection operations while moving the substrate P in the +Y and the −Y directions, respectively. Additionally, for example, as disclosed in JP-A-2004-146796 and the like, every time the substrate P moves in the Y-axis direction, a position of the substrate P in the X-axis direction may be changed by a small distance (e.g. by the amount of a single pixel).

As described above, the substrate P used in the present embodiment is the LTTC substrate (green sheet) before sintering and is supported by the film F. Thus, the ejection apparatus IJ ejects the liquid droplet D on the substrate P (green sheet) supported by the film F.

After terminating the ejection of the liquid droplet D on the substrate P, in order to carry the substrate P out from the first moving body 4, the controlling unit 10 controls the driving unit 8 to move the first moving body 4 to the second position A2. In the present embodiment, the driving unit 8 moves the moving bodies 4 to 7 together in the −Y direction (a direction from the first position A1 to the second position A2).

Since the insulating member 29 is arranged on the moving route of the first moving body 4 between the first and the second positions A1 and A2, it can be prevented that heat from the first moving body 4 moving between the first and the second positions A1 and A2 is diffused to the outside space 73.

Maintenance Operation

FIG. 18 is a schematic diagram showing a state where the first moving body 4 retaining the substrate P is allocated at the second position A2. In the present embodiment, among the four moving bodies 4 to 7, the first moving body 4 capable of retaining the substrate P is allocated on the most −Y side (toward the second position A2). As shown in FIG. 18, when the first moving body 4 is allocated at the second position A2, the size and number of each of the moving bodies 4 to 7, the distance between the first and the second positions A1 and A2, and the like are determined in such a manner that, among the four moving bodies 4 to 7, the fourth moving body 7 on the most +Y side (toward the first position A1) is allocated at the first position A1. Accordingly, as shown in FIG. 18, when the first moving body 4 is allocated at the second position A2, the fourth moving body 7 is allocated at the first position A1.

The controlling unit 10 controls the substrate carrying unit 27 to carry the substrate P out from the first moving body 4 allocated at the second position A2, as well as to carry a new substrate P to the first moving body 4.

Meanwhile, the controlling unit 10 allows the fourth moving body 7 allocated at the first position A1 to perform maintenance of the ejection head 3. The immersing unit 15 of the fourth moving body 7 works with the ejection head 3 to perform the maintenance process (immersing process). As described by referring to FIG. 11 and the like, the controlling unit 10 allows the immersing unit 15 to immerse the ejection head 3 in the liquid of the immersing unit 15 to clean the head. Additionally, as described above, the liquid droplet D is ejected in the state where the ejection head 3 faces the substrate P of the first moving body 4, whereby the ejection head 3 (plate member 37) can be heated by the heat of the first moving body 4 including the heater 47. Then, when the plate member 37 of the ejection head 3 is heated and left in that state, for example, the plate member 37 may be thermally deformed, thereby changing a distance (nozzle pitch) between the ejection outlets 1 formed on the plate member 37. When the nozzle pitch is changed, the liquid droplet D cannot be supplied at a desired position on the substrate P, so that the manufactured device shows poor performance. In the present embodiment, however, the heated ejection head 3 (plate member 37) is cooled by immersing the head in the liquid of the immersing unit 15, whereby the temperature of the ejection head 3 can be returned (adjusted) to a most appropriate temperature. Thus, the ejection apparatus IJ of the embodiment can suppress the occurrence of defects such as a change of the nozzle pitch.

Additionally, in the present embodiment, the controlling unit 10 can perform the maintenance of the ejection head 3 by using the fourth moving body 7 allocated at the first position A1 in parallel with at least a part of the process performed by using the first moving body 4 allocated at the second position A2 (the process of carrying the substrate P out from/to the first moving body 4). Thereby, a process efficiency of the liquid droplet ejection apparatus IJ can be improved.

After terminating the process by using the fourth moving body 7 (immersing process), the controlling unit 10 controls the driving unit 8 to move the moving bodies 4 to 7 together in the +Y direction (a direction from the second position A2 to the first position A1) to allocate the third moving body 6 at the first position A1. The controlling unit 10 allows the third moving body 6 allocated at the first position A1 to perform the maintenance of the ejection head 3. The wiping unit 14 of the third moving body 6 works with the ejection head 3 to perform the maintenance process (wiping process). As described with reference to FIG. 9 and the like, the controlling unit 10 allows the wiping member 57 of the wiping device 14 to wipe off a foreign substance adhering on the ejection surface 2 of the ejection head 3. In the present embodiment, before the wiping device 14 performs the wiping process, the immersing unit 15 performs the immersing process. Accordingly, a droplet of the liquid of the immersing unit 15 may be left on the ejection surface 2. The controlling unit 10 allows the wiping unit 14 to wipe off (remove) the liquid droplet thereof left thereon.

After terminating the wiping process of the ejection head 3 performed by the third moving body 6, the controlling unit 10 controls the driving device 8 to move the moving bodies 4 to 7 together in the +Y direction (the direction from the second position A2 to the first position A1), thereby allocating the second moving body 5 at the first position A1. The controlling unit 10 allows the second moving body 5 at the first position A1 to perform the maintenance of the ejection head 3. The capping unit 13 of the second moving body 5 works with the ejection head 3 to perform the maintenance process (capping process). As described with reference to FIG. 7 and the like, the controlling unit 10 allows the capping unit 13 to vacuum the ejection outlet 1 of the ejection head 3.

After termination of the capping process, the wiping process can be performed by allocating the second moving body 6 at the first position A1. Thus, even when any foreign substance (including a liquid droplet) is still present on the ejection surface 2 after the termination of the capping process, it can be removed by the wiping process.

After the termination of the capping process of the ejection head 3 by the second moving body 5, the controlling unit 10 controls the driving device 8 to move the moving bodies 4 to 7 together in the +Y direction (the direction from the second position A2 to the first position A1), thereby allocating the first moving body 4 at the first position A1. The controlling unit 10 starts ejecting the liquid droplet D from the ejection head 3 on the substrate P retained on the first moving body 4 allocated at the first position A1 (the pattern formation process). The first moving body 4 works with the ejection head 3 to perform the process of forming a pattern on the substrate P by the liquid droplet D (pattern formation process).

In the present embodiment, the liquid droplet D is ejected on the substrate P, which includes a plurality (for example, approximately 10 to 20 sheets) of substrates P (green sheet). Thus, a pattern is formed on each substrate P by ejecting the liquid droplet D. After the pattern formation of the liquid droplet D, the film F is removed from the substrate P. Then, the substrates P each having the pattern formed by the liquid droplet D are laminated to form a multilayer structure of the substrates P. Thereafter, the multilayer structure thereof is thermally processed. Thereby, the liquid droplets D on the substrates P are dried and fired, as well as the substrates P (green sheets) are fired. As a result, there can be formed an LTCC substrate (LTCC multilayer circuit board) having a predetermined wiring pattern.

Ejection Head Exchanging Operation

For example, since the ejection head 3 is likely to be deteriorated as time passes, it is exchanged with a new ejection head 3 if needed. In order to exchange the ejection head 3, as shown in FIG. 19A, the controlling unit 10 allows the pressure regulator 93 to depressurize the second space 92S. Along with the depressurization of the second space 92S, the first space 91S is also depressurized. The controlling unit 10 allows the pressure regulator 93 to depressurize the second space 92S (first space 91S) such that the lower surface (interface) of the functional liquid in the flow path between the first space 91S and the ejection head 3 is located upper (toward the first space 91S) than the connecting unit 99.

Then, in the state where the lower surface of the functional liquid in the flow path therebetween is located upper than the connecting unit 99, the ejection head 3 is detached from the flow path. In the present embodiment, the connecting unit 99 disconnects the second end of the flow path of the tube member 90 from the upper end of the supporting mechanism 39. Thereby, the retaining unit 38 including the ejection head 3 (the supporting mechanism 39 and the carriage member 11) is detached from the flow path formed by the tube member 90.

Next, as shown in FIG. 19C, the retaining unit 38 including the new ejection head 3 is connected to the second end of the flow path of the tube member 90 via the connecting unit 99. In this manner, for example, as in the case of exchanging the ejection head 3 or the like, when the ejection head 3 (the retaining unit 38 including the ejection head 3 in the present embodiment) is detached from the flow path such as the tube member 90, the second space 92S (the first space 91S) is depressurized to locate the lower surface of the functional liquid in the flow path between the first space 91S and the ejection head 3 at the position (toward the first space 91S) upper than the connecting unit 99, so that the leakage of the functional liquid can be suppressed. Then, after the new ejection head 3 is connected to the flow path, for example, as described with reference to FIG. 16A, the controlling unit 10 allows pressurization of the second space 92S (the first space 91S) and also allows the capping unit 13 to perform the capping process, thereby filling the flow path of the inside of the ejection head 3 with the functional liquid.

When exchanging the first container 91 contained in the second container 92, the open/close cover 98T is removed to open the second opening 98. Thereby, for example, even in the state where the second space 92S is depressurized, the second space 92S is made open to the atmosphere by opening the second opening 98. This makes it easier to drive (easier to open) the open/close door 97T in the state where the first opening 97 is closed, which allows the first container 91 to be exchanged smoothly.

As described above, in the present embodiment, the first container 91 is formed by the film deformed in accordance with the pressure of the second space 92S changing due to the operation of the pressure regulator 93, and the pressure of the first space 91S is adjusted by adjusting the pressure of the second space 92S. In this manner, the pressure of the functional liquid can be adjusted in the simple structure, while suppressing a change in the physical properties of the functional liquid. Additionally, the first space 91S formed by the first container 91 is an almost sealed space. Thus, if the pressure of the first space 91S is directly adjusted by the pressure regulator 93 including the vacuuming system or the gas supplying system, a liquid component (e.g. a dispersion medium or solvent) of the functional liquid contained in the first space 91S is evaporated or the like, so that at least one of the concentration and the viscosity of the functional liquid may be changed. For example, if the pressure of the space is directly adjusted by the pressure regulator 93 with the vacuuming system, the liquid component of the functional liquid contained in the space is evaporated, so that the concentration and/or the viscosity of the functional liquid may be increased. In the present embodiment, instead of directly adjusting the pressure of the first space 91S by the pressure regulator 93, the pressure of the second space 92S between the first container 91 having the at least a part made of the film and the second container 92 is adjusted by the pressure regulator 93. Thereby, the pressure of the first space 91S can be adjusted to a desired level, while suppressing a change in the physical properties such as concentration and/or viscosity of the functional liquid due to evaporation of the liquid or the like in the sealed first space 91S. Accordingly, the ejection apparatus of the present embodiment can suppress the occurrence of a foreign substance resulting from the change in the physical properties of the functional liquid, and therefore can manufacture a device exhibiting a desired performance by ejecting a liquid droplet in a desired state. In addition, in this embodiment, the pressure of the functional liquid can be adjusted in the simple structure, thereby suppressing the occurrence of defects such as a clogging or the like of the flow path due to a part of the functional liquid. Moreover, maintenance tasks and the like can be smoothly performed.

In addition, the pressure of the second space 92S (first space 91S) is adjusted (optimized) in accordance with the positional relationship between the surface of the functional liquid of the first container 91 and the ejection outlet 1 of the ejection head 3. In this manner, the liquid droplet D can be ejected in a desired state, while suppressing the leakage of the functional liquid from the ejection outlet 1 thereof.

Furthermore, depending on the kind of the functional liquid, the physical properties thereof may be changed due to a temperature change. However, since the temperature regulator 94 is provided, the change of the physical properties thereof due to the temperature change can be suppressed. In addition, even when the operation of the liquid droplet ejection apparatus IJ is stopped for a long time (when the operation of ejecting a liquid droplet from the ejection outlet 1 of the ejection head 3 is stopped for a long time), the change in physical properties thereof can be suppressed by continuously cooling the functional liquid of the first container 91. Then, since the second container 92 can serve as a refrigerator, the first container 91 can be left in the second container 92 even if the operation of the ejection apparatus IJ is stopped for a long time. Thus, in order to suppress the change in the physical properties of the functional liquid, there is no need for carrying the first container 91 containing the functional liquid into a refrigerator prepared aside from the ejection apparatus IJ.

In addition, in the present embodiment, as in the case of exchanging the ejection head 3, when the ejection head 3 is detached from the flow path, the pressure regulator 93 is used to depressurize the second space 92S such that the lower surface (interface) of the functional liquid in the flow path between the first space 91S and the ejection head 3 is located upper than at least the connecting unit 99. In this manner, while suppressing the leakage of the functional liquid, the ejection head 3 can be detached from the flow path to be exchanged with a new ejection head 3. Thus, maintenance tasks and the like can be smoothly performed. Consequently, in the maintenance tasks and the like, the wasted amount of the functional liquid can be minimized.

Second Embodiment

Next will be described a second embodiment of the invention. Hereinafter, the same reference numerals will be given to the same or equivalent components as those in the first embodiment and thus descriptions thereof will be simplified or omitted.

Figure 20:
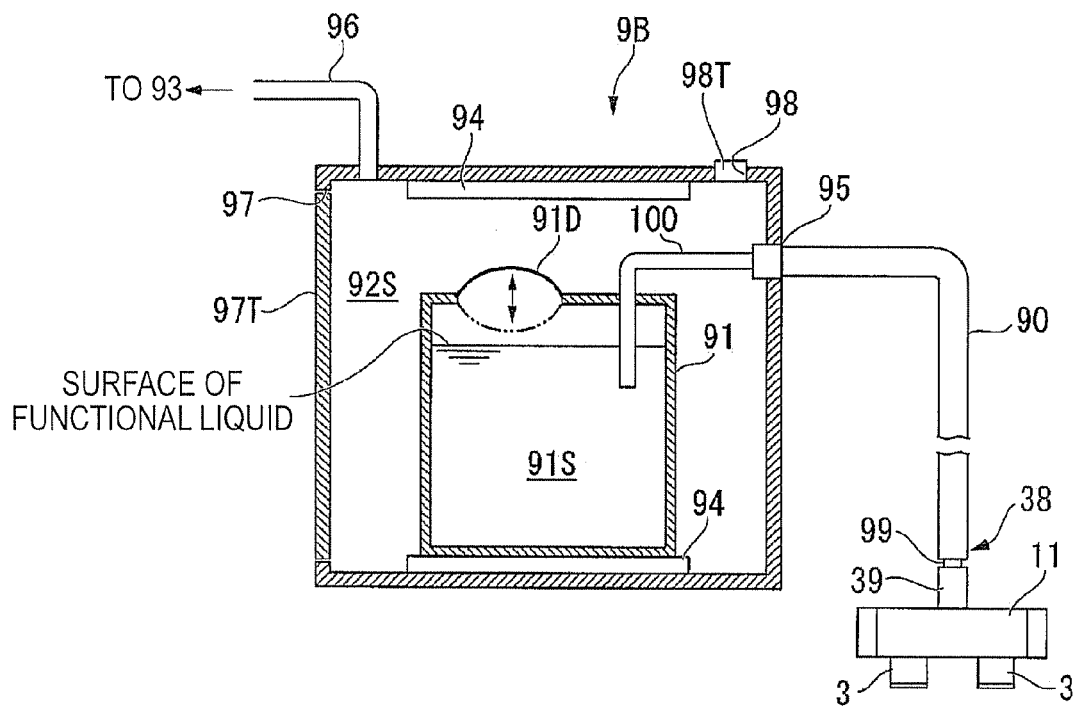
FIG. 20 is a side sectional view showing an example of a functional liquid containing unit according to a second embodiment of the invention.

FIG. 20 is a schematic diagram showing a functional liquid containing unit 9B according to the second embodiment of the invention. In the foregoing first embodiment, the first container 91 is almost entirely made of a flexible film. However, as a characteristic part of the second embodiment, the first container 91 is partially made of a flexible film 91D.

In FIG. 20, the functional liquid containing unit 9B includes the first container 91 that is connected to the ejection head 3 via the flow path to form the first space 91S for containing the functional liquid to be supplied to the ejection head 3, the second container 92 for containing the first container 91 to form the second space 92S between the first container 91 and the second container 92, the pressure regulator 93 for adjusting the pressure of the second space 92S, and the temperature regulator 94 for adjusting the temperature of the functional liquid of the first container 91. The first space 91S formed by the first container 91 is an almost sealed space. For example, the first container 91 is made of a combination of a hard plate-like member such as a metallic plate or a plastic plate and a flexible thin film 91D such as a plastic thin sheet member. The film 91D of the first container 91 is deformed in accordance with the operation of the pressure regulator 93.

As in the above first embodiment, for example, the second space 92 is a box-like member formed by combining a plurality of hard plate-like members such as metal plates or plastic plates.

In the second embodiment, the first space 91S of the first container 91 is connected to the connecting mechanism 95 via a flow path of a second tube member 100.

When the pressure of the second space 92S changes due to the operation of the pressure regulator 93, the film 91D of the first container 91 is deformed in accordance with the pressure of the second space 92S. Like the above-described first embodiment, also in the present embodiment, the pressure of the first space 91S is changed along with the pressure of the second space 92S changing in accordance with the operation of the pressure regulator 93.

As described hereinabove, also in the second embodiment, the pressure of the functional liquid can be adjusted in the simple structure, while suppressing the change in the physical properties of the functional liquid.

Each of the above first and the second embodiments has described the example in which the surface of the functional liquid of the first container 91 is located upper than the ejection outlet 1 of the ejection head 3. However, the surface thereof may be located lower than the ejection outlet 1 thereof. In this case, the pressure regulator 93 applies a pressure such that the pressure of the second space 92S becomes higher than at least an atmospheric pressure. In other words, the pressure of the second space 92S is adjusted in accordance with a positional relationship in the Z-axis direction between the surface of the functional liquid of the first container 91 and the ejection outlet 1 of the ejection head 3 in the state where the flow path connecting the first space 91S to the ejection outlet 1 is filled with the functional liquid, that is, in accordance with a so-called water head difference. Thereby, the liquid droplet D can be ejected in a desired state, while suppressing the leakage of the functional liquid from the ejection outlet 1 of the ejection head 3.

In each of the above embodiments, the temperature regulator 94 cools the functional liquid of the first container 91. However, depending on the kind (physical properties) of the functional liquid, heating may be preferable. In this case, the controlling unit 10 allows the temperature regulator 94 to heat the functional liquid of the first container 91.

The above sequential order of the processes by using the foregoing moving bodies 4, 5, 6, and 7 is just an example. For example, after the capping process, the immersing process may be performed, followed by the wiping process. Conversely, after the immersing process, the capping process and then the wiping process may be performed. In addition, alternatively, after the immersing process, the wiping process and then the capping process may be performed, and in turn, again, the wiping process may be performed, so as to perform the same process (the wiping process in the present case) multiple times. The arrangement of the moving bodies 4 to 7 is determined based on the sequential order of the processes.

In addition, in terms of the maintenance processes by using the second, the third, and the fourth moving bodies 5, 6, and 7, it may be unnecessary to use all of the moving bodies 5 to 7 in every maintenance operation. For example, without the capping process, only the immersing and wiping processes may be performed, or without the immersing process, only the capping and wiping processes may be performed. Furthermore, without the immersing and capping processes, only the wiping process may be performed, or without the immersing and wiping processes, only the capping process may be performed.

The maintenance process by using the above moving bodies 5, 6, and 7 can be performed at a predetermined timing. In the present embodiment, the maintenance process is performed every time the substrate P is carried out from/to the first moving body 4. Instead of this, for example, the maintenance process may be performed for every lot and at every predetermined time interval.

Additionally, each of the embodiments described above employs the LTCC substrate (green sheet) as the substrate P and describes the example where a wiring pattern (a circuit pattern) is formed thereon. However, as the substrate P, instead of a green sheet, a glass substrate, a semiconductor wafer or the like may be selected appropriately in accordance with a device to be manufactured. Moreover, as the conductive minute particles of functional liquid to be used, instead of silver, for example, as disclosed in JP-A-2005-34837 and the like, metallic minute particles made of gold, copper, palladium, nickel or the like, or a conductive polymer may be used. Additionally, a dispersion medium to be used can be selected appropriately in accordance with the conductive minute particles. Furthermore, not only a wiring pattern but also at least a part of a thin film transistor (TFT) may be formed.

In addition, the device that can be manufactured by using the liquid droplet ejection apparatus IJ is not limited to a circuit board. For example, at least part of a liquid crystal apparatus, such as a color filter or an alignment film, may be formed, and at least a part of an organic EL device may also be formed.

The entire disclosure of Japanese Patent Application No. 2006-351393, filed Dec. 27, 2006 is expressly incorporated by reference herein.

What is claimed is:

1. A liquid droplet ejection apparatus, comprising:
   an ejection head having an ejection surface with an ejection outlet for ejecting a droplet of a functional liquid;
   a first container connected to the ejection head via a flow path to form a first space for containing the functional liquid that is to be supplied to the ejection head;
   a second container for containing the first container to form a second space between the first and the second containers;
   a pressure regulator for adjusting a pressure of the second space; and
   a temperature regulator disposed on an inner surface of the second container for adjusting a temperature of the functional liquid of the first container, at least a part of the first container being made of a film deformed in accordance with an operation of the pressure regulator.

2. The liquid droplet ejection apparatus according to claim 1, wherein the pressure regulator adjusts the pressure of the second space in accordance with a positional relationship between a surface of the functional liquid of the first container and the ejection outlet of the ejection head.

3. The liquid droplet ejection apparatus according to claim 1, further comprising a connector for detachably connecting the ejection head to the flow path, wherein when the ejection head is detached from the flow path, the pressure regulator depressurizes the second space.

4. The liquid droplet ejection apparatus according to claim 1, further comprising an opening formed in the second container to allow an inside space of the second container to communicate with an outside space thereof and an open/close mechanism for opening and closing the opening.

5. The liquid droplet ejection apparatus according to claim 4, wherein the opening includes at least one of a first opening for passing the first container through between the inside space of the second container and the outside space thereof and a second opening for opening the inside space of the second container to the atmosphere.

6. A method for forming a device pattern comprising:
   ejecting a liquid droplet on a substrate by using the liquid droplet ejection apparatus according to claim 1 to form the pattern thereon; and
   drying the liquid droplet on the substrate.

7. A liquid droplet ejection apparatus, comprising:
   an ejection head having an ejection surface with an ejection outlet for ejecting a droplet of a functional liquid to an area outside the ejection head;
   a first container connected to the ejection head via a flow path to form a first space for containing the functional liquid that is to be supplied to the ejection head;
   a second container for containing the first container to form a second space between the first and the second containers;
   a pressure regulator for adjusting a pressure of the second space; and
   a temperature regulator for adjusting a temperature of the functional liquid of the first container, at least a part of the first container being made of a film deformed in accordance with an operation of the pressure regulator;
   wherein the pressure regulator adjusts the pressure of the second space in accordance with a positional relationship between a surface of the functional liquid of the first container and the ejection outlet of the ejection head, and
   wherein the pressure regulator depressurizes the second space below an atmospheric pressure in the area outside the ejection head such that the surface of the functional liquid of the first container remains above the ejection outlet of the ejection head.

8. A liquid droplet ejection apparatus, comprising:
   an ejection head having an ejection surface with an ejection outlet for ejecting a droplet of a functional liquid;
   a first container connected to the ejection head via a flow path to form a first space for containing the functional liquid that is to be supplied to the ejection head;
   a second container for containing the first container to form a second space between the first and the second containers;
   a pressure regulator for adjusting a pressure of the second space; and
   a temperature regulator for adjusting a temperature of the functional liquid of the first container, at least a part of the first container being made of a film deformed in accordance with an operation of the pressure regulator;
   wherein the temperature regulator cools the functional liquid of the first container.

9. The liquid droplet ejection apparatus according to claim 8, wherein the temperature regulator reduces the temperature of the functional liquid of the first container lower than at least a temperature near the ejection outlet of the ejection head.

* * * * *